(12) United States Patent
Miyamoto et al.

(10) Patent No.: US 8,119,287 B2
(45) Date of Patent: Feb. 21, 2012

(54) NONAQUEOUS ELECTROLYTE RECHARGEABLE BATTERY, AND NEGATIVE ELECTRODE AND MATERIAL THEREOF

(75) Inventors: Yukihiro Miyamoto, Kanagawa (JP); Masao Miyake, Ibaraki (JP); Etsuko Miyake, legal representative, Aichi (JP); Tooru Fuse, Ibaraki (JP); Tomohiro Satou, Ibaraki (JP); Youji Arita, Kanagawa (JP)

(73) Assignee: Mitsubishi Chemical Corporation, Tokyo (JP)

( * ) Notice: Subject to any disclaimer, the term of this patent is extended or adjusted under 35 U.S.C. 154(b) by 0 days.

(21) Appl. No.: 11/914,494

(22) PCT Filed: May 15, 2006

(86) PCT No.: PCT/JP2006/309639
§ 371 (c)(1),
(2), (4) Date: Nov. 15, 2007

(87) PCT Pub. No.: WO2006/123601
PCT Pub. Date: Nov. 23, 2006

(65) Prior Publication Data
US 2009/0181304 A1 Jul. 16, 2009

(30) Foreign Application Priority Data

May 16, 2005 (JP) .................................. 2005-142827
Aug. 18, 2005 (JP) .................................. 2005-237871

(51) Int. Cl.
*H01M 4/58* (2010.01)
*H01M 10/36* (2010.01)

(52) U.S. Cl. .................. 429/231.8; 429/218.1; 429/523; 429/530; 252/182.1

(58) Field of Classification Search ............... 429/218.1, 429/231.8, 523, 530; 252/182.1
See application file for complete search history.

(56) References Cited

U.S. PATENT DOCUMENTS

| 5,698,340 A | * | 12/1997 | Xue et al. ................. 429/231.4 |
| 7,037,581 B2 | * | 5/2006 | Aramata et al. ............. 428/402 |
| 2005/0214644 A1 | * | 9/2005 | Aramata et al. ........... 429/218.1 |

FOREIGN PATENT DOCUMENTS

| CN | 1674325 A | 9/2005 |
| JP | 10-302770 | 11/1998 |
| JP | 10-312804 | 11/1998 |
| JP | 11-135115 | 5/1999 |
| JP | 11-339796 | 12/1999 |
| JP | 2000-149951 | 5/2000 |
| JP | 2002-170560 | 6/2002 |
| JP | 2002-356314 | 12/2002 |

OTHER PUBLICATIONS

U.S. Appl. No. 11/629,654, filed Dec. 15, 2006, Miyamoto, et al.

* cited by examiner

*Primary Examiner* — Patrick Ryan
*Assistant Examiner* — Ladan Mohaddes
(74) *Attorney, Agent, or Firm* — Oblon, Spivak, McClelland, Maier & Neustadt, L.L.P.

(57) ABSTRACT

A negative electrode material for a nonaqueous electrolyte rechargeable battery that can stably and efficiently realize a high-performance nonaqueous electrolyte rechargeable battery in which a high discharge capacity, high charge/discharge efficiency at an initial stage and during charge/discharge cycles, and excellent charge/discharge cycle properties are provided as well as electrode expansion in volume after charge/discharge cycles is suppressed. The negative electrode material for a nonaqueous electrolyte rechargeable battery in the form of particles having, at least on the surface thereof, a compound of the phase in which an element Z is present in Si in a non-equilibrium state. The compound is expressed by the general formula $SiZ_xM_y$, where Z represents C and/or N, M represents an element other than C and N, and when the concentration of the element Z in a compound $Si_aZ_p$, where each of a and p is an integer, having a composition closest to that of Si and present in an equilibrium state is presumed to be 100 atomic percent, the concentration of the element Z in the compound $SiZ_xM_y$ is in the range of 10 to 95 atomic percent, and y is in the range of 0 to 0.5.

6 Claims, 1 Drawing Sheet

NONAQUEOUS ELECTROLYTE RECHARGEABLE BATTERY, AND NEGATIVE ELECTRODE AND MATERIAL THEREOF

TECHNICAL FIELD

The present invention relates to a negative electrode material for a nonaqueous electrolyte rechargeable battery, a negative electrode for a nonaqueous electrolyte rechargeable battery using the negative electrode material, and a nonaqueous electrolyte rechargeable battery using the negative electrode for a nonaqueous electrolyte rechargeable battery.

BACKGROUND ART

Recently, the need for high-capacity rechargeable batteries has been increasing with the miniaturization of electronic devices. In particular, nonaqueous solvent-type lithium rechargeable batteries are attracting public attention for their energy density which is higher than that of nickel-cadmium batteries and nickel-hydrogen batteries. Although the capacity of lithium rechargeable batteries has been increasing, nowadays a much higher capacity is required as the performance that batteries are expected to have is getting higher.

As a negative electrode material for such a lithium rechargeable battery, graphite and other materials have been investigated. Graphite has been conventionally used because of its excellent charge/discharge cycle properties, suppressed electrode expansion in volume and low cost. However, a negative electrode material derived from graphite has a limitation in that the maximum theoretical capacity thereof is 372 mAh/g and thus cannot be further improved in capacity. Therefore, research focus is shifting from graphite negative electrodes to alloy-type negative electrodes containing a metal such as Si, Sn and Al, which forms an alloy together with lithium having a high theoretical capacity. Si has an especially high capacity and the application thereof as a negative electrode has been widely attempted. However, an Si-based negative electrode markedly expands in volume during the reaction with lithium, thereby posing problems that Si is pulverized or removed from a current collector, the reactivity thereof with an electrolyte solution is high, and the charge/discharge cycle properties are poor. This leads to a need for a novel negative electrode that has the advantages of the alloy-type negative electrode and exhibits suppressed reactivity with an electrolyte solution, excellent charge/discharge cycle properties and a weaker tendency to expand in volume.

Patent Document 1 described below states that heat treatment of Si particles and a carbon precursor provides a negative electrode material that consists of Si and C and contains little or no SiC, and that the absence of SiC having no capacity allows the negative electrode material to have a high capacity and excellent charge/discharge cycle properties.

Patent Document 2 described below states that, when partially nitrided by heat treatment under nitrogen atmosphere, particles of silicon oxide form $SiN_xO_y$ particles, which provide a lithium rechargeable battery excellent in both capacity and charge/discharge cycle properties.

Patent Document 3 described below states that the silicon particles containing a small thermodynamically-estimated amount of silicon boride such as $SiB_4$ and 0.1 to 50 wt % of substantially supercooled boron provide a lithium rechargeable battery that exhibits a high capacity and an initial charge/discharge efficiency and excellent charge/discharge cycle properties.

Patent Document 4 described below states that the use of a thin-film electrode obtained by forming a thin film of Si or another similar element on a copper film substrate via vapor deposition or sputtering results in a lithium rechargeable battery that has a low electric resistance and high current-collecting properties as well as excellent voltage, capacity and charge/discharge properties.

Patent Document 1: Japanese Unexamined Patent Application Publication No. H11-339796
Patent Document 2: Japanese Unexamined Patent Application Publication No. 2002-356314
Patent Document 3: Japanese Unexamined Patent Application Publication No. 2000-149951
Patent Document 4: Japanese Unexamined Patent Application Publication No. H11-135115

Along with the growing need for higher-capacity batteries these days, the application of an Si-based negative electrode material, a high-capacity material, is increasingly desired. However, such an Si-based negative electrode material has problems that:

the increase in irreversible capacity and the consumption of lithium contained in a positive electrode active substance caused by the reaction with an electrolyte solution result in a lowered battery capacity;

pulverization and removal from a current collector of Si caused by the expansion and contraction in volume due to the insertion and removal of lithium atoms degrade the charge/discharge cycle properties;

the decrease in the amount of an active substance capable of occluding and releasing electrons due to the reaction with an electrolyte solution during charge/discharge cycles also degrades the charge/discharge cycle properties; and electrode expansion in volume due to the insertion of lithium atoms accumulates during charge/discharge cycles, thereby increasing the battery volume, in other words, reducing the battery capacity per unit volume.

Consequently, besides the use of an Si-based active substance for improving the capacity, suppressing the reaction with an electrolyte solution, enhancing the charge/discharge efficiency at an initial stage and during charge/discharge cycles, improving the charge/discharge cycle properties and preventing the increase in electrode expansion in volume after charge/discharge cycles have been performed are strongly demanded to further improve the capacity of a lithium rechargeable battery.

However, the composite negative electrode material consisting of Si particles and carbon atoms disclosed in Patent Document 1 cannot improve the charge/discharge cycle properties sufficiently. This is because the composite material is made through heat treatment of a carbon precursor and thus the Si particles and carbon atoms exist in separate portions in the composite material, so that in the portions in which the Si particles are present, it is difficult to prevent the expansion in volume and pulverization of Si caused by discharge and charge.

In Patent Document 2, particles of the partially nitrided silicon oxide $SiN_xO_y$ are formed using $SiO_2$ as material, and thus the content of oxygen, which may react with Li, is large. This reduces the charge/discharge efficiency at an initial stage, thus leading to the problem that the battery capacity is limited.

As for Patent Document 3, the disclosed material, which is made by dispersing boron atoms in Si containing a small amount of silicon boride, expands in volume during charge because of the reaction of the boron atoms themselves with Li. This results in insufficient prevention of the interruption of conductive paths between Si atoms and current collectors, thus posing problems concerning the charge/discharge cycle properties.

In Patent Document 4, such interruption of conductive paths between Si atoms and current collectors is avoided by forming a thin film of Si via vapor deposition or sputtering, and thus the charge/discharge properties are improved. However, the reactivity between Si and an electrolyte solution is not suppressed, so that the charge/discharge cycle properties are insufficient. Furthermore, the use of a time-consuming film-forming method such as sputtering raises a productivity issue as well.

SUMMARY OF THE INVENTION

An object of the present invention is to provide a negative electrode material for a nonaqueous electrolyte rechargeable battery and a negative electrode for a nonaqueous electrolyte rechargeable battery realizing a nonaqueous electrolyte rechargeable battery that is excellent in the charge/discharge cycle properties and exhibits a high discharge capacity, a high charge/discharge efficiency at an initial stage and during charge/discharge cycles, and suppressed electrode expansion in volume after charge/discharge cycles, as well as to provide a nonaqueous electrolyte rechargeable battery made therefrom.

The negative electrode material for a nonaqueous electrolyte rechargeable battery according to the present invention is a negative electrode material for a nonaqueous electrolyte rechargeable battery in a form of particles having, at least on the surface thereof, a compound of a phase in which an element Z is present in Si in a non-equilibrium state, wherein the compound contains Si, the element Z and another element M in the composition expressed by the general formula $SiZ_xM_y$ (where Z, x, M and y follow the conditions described below), the element Z is at least one of C and N, x is the value determined in such a manner that, when the concentration of Z in the compound $Si_aZ_p$ (where each of a and p is an integer) having a composition closest to that of Si and present in an equilibrium state is expressed by the formula p/(a+p), the Z concentration ratio Q(Z) expressed by the following formula is in the range of 0.10 to 0.95:

$$Q(Z) = [x/(1+x)]/[p/(a+p)]$$

the element M is one element or two or more elements selected from elements other than Si and the element Z, and y is a number within the range of 0 to 0.5.

The negative electrode for a nonaqueous electrolyte rechargeable battery according to the present invention contains the abovementioned negative electrode material as a negative electrode active substance.

The nonaqueous electrolyte rechargeable battery according to the present invention includes the abovementioned negative electrode.

DETAILED DESCRIPTIONS

Figure 1:
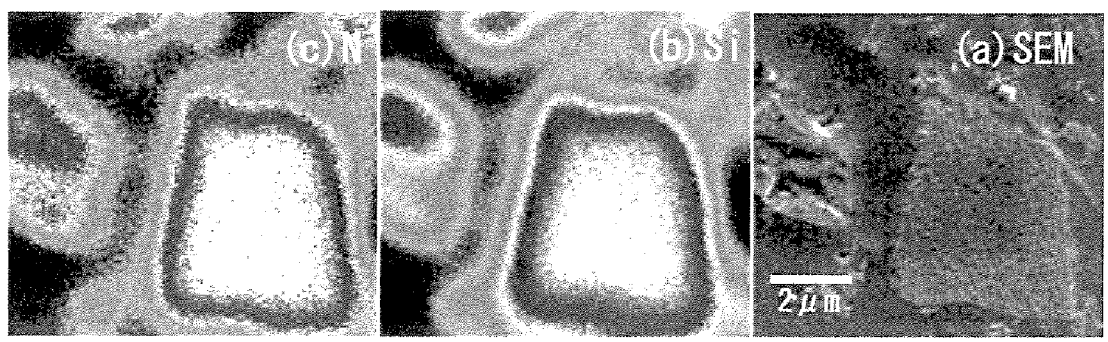
FIG. 1a is an SEM image of the particles of the negative electrode material obtained in Example 1.
FIGS. 1b and 1c are the distribution charts of Si and N, respectively, obtained through EMPA measurement.

The inventors carried out extensive investigations on particles of a negative electrode material containing Si. As a result, it was found that the factors that progress degradation include, besides the interruption of conductive paths due to expansion and contraction in volume, the reaction between the Si particles and an electrolyte solution during charge/discharge cycles. Also, it was revealed that deploying an element Z that is C and/or N in the form of an $SiZ_x$ layer at least on the surface of the Si particles, which are highly reactive with an electrolyte solution, so as to be in a non-equilibrium state and to fall within a predetermined range of concentration results in almost complete prevention of the formation of the compound $Si_aZ_p$ (where each of a and p is an integer) that has a composition closest to that of Si and exists in an equilibrium state or a slight amount of such a compound being formed. This led to the finding that it is possible to produce stably and efficiently a high-performance nonaqueous electrolyte rechargeable battery, in which the activity of Si, described later, is effectively reduced, the reactivity with an electrolyte solution is suppressed, the discharge capacity is high, the charge/discharge efficiency at an initial stage and during charge/discharge cycles is high, the charge/discharge cycle properties are excellent, and the electrode expansion in volume after charge/discharge cycles is suppressed.

The activity is explained below.

In general, the activity is a kind of thermodynamic concentration. In a multicomponent system consisting of the amounts of substance $n_1, n_2 \ldots$, the value $a_i$ defined by the following formula is referred to as the activity:

$$\mu_i - \mu_i^0 = RT \log a_i$$

where $\mu_i$ represents the chemical potential of the component i and $\mu_i^0$ represents the chemical potential of the pure substance.

In addition, the ratio $\gamma_i$ of the activity $a_i$ to the concentration $c_i$, which is expressed by the formula $a_i/c_i = \gamma_i$, is referred to as the activity coefficient.

For example, when a system consisting of solvent and solute is considered as a thermodynamic solution, the activity coefficient is a quantity that corresponds to the difference between the chemical potential of a given component assuming that the system is an ideal solution and the true chemical potential of the component assuming that the system is a real solution. In a real solution containing the component i as a solute, the lower the concentration of the solute is, the more the system approaches an ideal solution containing the component i as a solute, and the closer to one the activity coefficient is. Conversely, in a real solution containing the component i as a solvent, the higher the concentration of the solvent is, the more the system approaches an ideal solution containing the component i as a solvent, and the closer to one the activity coefficient is. In addition, when the chemical potential of the component i is lower in the case the system is regarded as a real solution than in the case the system is regarded as an ideal solution, $\gamma_i$ is less than one.

In the present invention, the component i is Si, and thus adding an element Z as solute into Si acting as solvent reduces the activity $a_i$ of the solvent Si and makes $\gamma_i$ less than one, so that the Si compound containing the element Z (a solid solution; regarded as a real solution) is more stable than pure Si (regarded as an ideal solution). This situation seems to suppress the reactivity of the surface of the particles with an electrolyte solution.

However, the formation of a compound that consists of Si and the element Z and exists in an equilibrium state, such as $Si_aZ_p$, inside $SiZ_x$ would make it impossible to reduce the activity of Si effectively. It is therefore necessary that the element Z exists in Si in a non-equilibrium state.

The scope of the present invention is a negative electrode material for a nonaqueous electrolyte rechargeable battery in the form of particles having, at least on the surface thereof, a compound of a phase in which an element Z is present in Si in a non-equilibrium state, wherein the compound contains Si, the element Z and another element M in the composition expressed by the general formula $SiZ_xM_y$ (where Z, x, M and y follow the conditions described below).

The element Z is an element consisting of C and/or N.

The variable x is the value determined in such a manner that, when the concentration of Z in the compound $Si_aZ_p$ (where each of a and p is an integer) having a composition closest to that of Si and present in an equilibrium state is expressed by the formula p/(a+p), the Z concentration ratio Q(Z) expressed by the following formula is in the range of 0.10 to 0.95:

$$Q(Z)=[x/(1+x)]/[p/(a+p)]$$

The element M is one element or two or more elements selected from elements other than Si and the element Z.

The variable y is a number within the range of 0 to 0.5.

The compound $Si_aZ_p$ having a composition closest to that of Si and present in an equilibrium state according to the present invention is found in a phase diagram of Si and the element Z (e.g., "Desk Handbooks Phase Diagrams for Binary Alloys" published by ASM International) or other sources. In the present invention, the concentration of Z in $Si_aZ_p$ (p/(a+p)) is used to specify the Z concentration ratio Q(Z), described above, and then to define the value x.

The compound present in an equilibrium state described herein means a stoichiometric compound such as the compound $Si_aZ_p$ shown at the top of shape in the abovementioned phase diagram or other sources. For example, when the element Z is C, SiC is known to be a stable compound. In the present invention, this compound is regarded as the compound present in an equilibrium state. In the case the element Z is C, therefore, SiC corresponds to $Si_aZ_p$ according to the present invention.

In another case where, for example, the element Z is N, $Si_3N_4$ is known to be the most stable compound, but the presence of $Si_2N_3$ and SiN as a stoichiometric compound has also been reported. In the present invention, all of these compounds are regarded as the compound present in an equilibrium state. In the case the element Z is N, therefore, SiN corresponds to $Si_aZ_p$ having a composition closest to that of Si according to the present invention.

On the other hand, the compound present in a non-equilibrium state means compounds other than the compound present in an equilibrium state. The compound present in a non-equilibrium state does not form any stoichiometric compound, and it contains uniformly dispersed Si atoms and Z atoms when observed macroscopically.

The present invention enables stable and efficient production of a high-performance nonaqueous electrolyte rechargeable battery, in which the discharge capacity is high, the charge/discharge efficiency at an initial stage and during charge/discharge cycles is high, the charge/discharge cycle properties are excellent, and the electrode expansion in volume after charge/discharge cycles is suppressed.

The negative electrode for a nonaqueous electrolyte rechargeable battery and the nonaqueous electrolyte rechargeable battery according to the present invention can be suitably used in several fields to which a nonaqueous electrolyte rechargeable battery is applied, such as an electronic device.

The present invention is described in more detail below, but the present invention is not limited to the following statement, and may be modified for implementation without departing from the scope of the present invention.

[1] Negative Electrode Material for a Nonaqueous Electrolyte Rechargeable Battery The negative electrode material for a nonaqueous electrolyte rechargeable battery according to the present invention is a negative electrode material for a nonaqueous electrolyte rechargeable battery in the form of particles having, at least on the surface thereof, a compound of a phase in which an element Z is present in Si in a non-equilibrium state, and the abovementioned compound contains Si, the element Z and another element M in the composition expressed by the general formula $SiZ_xM_y$.

Hereinafter, the negative electrode material containing Si and the element Z in the form of particles according to the present invention may be abbreviated to "the negative electrode material particles of the present invention." "The negative electrode" is prepared by forming a layer containing a negative electrode active substance, as which the negative electrode material particles of the present invention are used, on a current collector.

The thus-prepared negative electrode material particles of the present invention are extremely useful as a negative electrode substance used in a nonaqueous electrolyte rechargeable battery having positive and negative electrodes capable of occluding/releasing lithium ions and an electrolyte, such as a lithium rechargeable battery. For example, the nonaqueous electrolyte rechargeable battery configured in the combination of the negative electrode material particles of the present invention acting as the negative electrode active substance, a commonly used metal-chalcogenide-based positive electrode for a lithium rechargeable battery, and an organic electrolyte solution mainly constituted of a carbonate solvent exhibits a large capacity, a small irreversible capacity found during an initial charge/discharge cycle, excellent charge/discharge cycle properties, suppressed electrode expansion in volume after charge/discharge cycles, favorable stability and reliability even when left under high-temperature conditions, and extremely excellent high-efficiency-discharging properties and low-temperature discharging properties.

[Composition of the Compound $SiZ_xM_y$]

<Element Z in the Compound $SiZ_xM_y$>

The element Z contained in the compound $SiZ_xM_y$ is an element being C and/or N.

The reason why elements C and/or N are used as the element Z is that these elements can compose a compound $Si_aZ_p$ (where each of a and p is an integer) having a composition closest to that of Si and a melting point higher than Si has and present in an equilibrium state, and that this high-melting-point compound is usually a stable compound of a large negative free energy, thus effectively reducing the activity of the surface of the Si-based negative electrode material particles when having a melting point higher than that of Si and suppressing the reactivity with an electrolyte solution.

In addition, it seems that the elements C and N, which have a relatively small covalent radius, can be uniformly dispersed as the element Z inside the compound $SiZ_xM_y$ without forming any compound present in an equilibrium state therein, and thereby effectively inhibit the reaction with the electrolyte solution, although the detailed mechanisms thereof are unknown.

The reason why the element Z does not include oxygen is that the use of oxygen, which has a high reactivity with Li, as the element Z results in Li atoms being trapped and thus the discharge capacity and the initial charge/discharge efficiency being reduced, spoiling the effects of the present invention.

<Element M in the Compound $SiZ_xM_y$>

The element M contained in the compound $SiZ_xM_y$ is one element or two or more elements selected from elements other than Si and the element Z, preferably is one element or two or more elements selected from the elements belonging to Groups IV, V, VI, VIII, IX, X, XI, XIII and XVI in the periodic table, more preferably is selected from elements Ti, Zr, V, Cr, W, B and O, and most preferably is selected from elements Ti, Zr, W and O.

<Composition of the Compound $SiZ_xM_y$>

In the compound $SiZ_xM_y$, the variable x used in $SiZ_xM_y$ is the value determined in such a manner that, when the concentration of Z in the compound $Si_aZ_p$ (where each of a and p is an integer) having a composition closest to that of Si and present in an equilibrium state is expressed by the formula p/(a+p), the Z concentration ratio Q(Z) expressed by the following formula is typically 0.10 or higher, preferably 0.15 or higher, more preferably 0.30 or higher, and most preferably 0.40 or higher, as well as is typically 0.95 or lower, preferably 0.85 or lower, more preferably 0.75 or lower, and most preferably 0.65 or lower:

$$Q(Z)=[x/(1+x)]/[p/(a+p)]$$

The Z concentration ratio Q(Z) lower than the abovementioned lower limits would result in less effective reduction in the activity of the surface of the negative electrode material particles of the present invention, so in this case the reactivity with an electrolyte solution cannot be suppressed, the electrode expansion in volume is large, and favorable charge/discharge cycle properties cannot be achieved. On the other hand, the Z concentration ratio Q(Z) higher than the abovementioned upper limits would result in the formation of a stable compound present in an equilibrium state, such as $Si_aZ_p$. In this case, the activity of Si is not reduced even if the amount of the element Z is increased, so that it may be impossible to reduce the reactivity with an electrolyte solution. Furthermore, since the stable compound present in an equilibrium state, $Si_aZ_p$, has a low conductivity and the presence of such a compound may reduce the conductivity of the negative electrode material particles, making it difficult to dope/dedope lithium ions. This may result in the impossibility of charge/discharge of the battery. The Z concentration ratio Q(Z) being 1 is not preferable because it means that Si is in the form of a stable compound, $Si_aZ_p$.

In addition, when both elements C and N are used as the element Z, the Z concentration ratio Q(Z) is calculated from the concentration of each Z based on $Si_aZ_p$ of each element, and the sum of the two Z concentration ratios is regarded as the Z concentration ratio Q(Z).

As described in the examples later, the composition of the negative electrode material particles can be obtained by, for example, calculating the atomic percentage of individual constituents, such as Si and the element Z, through depth profile measurement, in which the negative electrode particles are placed on the sample stage of an X-ray photoelectron spectrometer (e.g., "ESCA" manufactured by ULVAC-PHI, Inc.) so that the surfaces thereof form a flat plane, and then the depth profile of the sample is determined while sputtering Ar, using aluminum Kα radiation as the X-ray source.

Composition when the Element Z is C

When the element Z is C, the abovementioned Z concentration ratio Q(Z) (hereinafter it may be referred to as "the C concentration ratio Q(C)") is typically 0.10 or higher, preferably 0.15 or higher, more preferably 0.20 or higher, as well as is typically 0.85 or lower and preferably 0.65 or lower. As described earlier, when the element Z is C, SiC is the compound $Si_aZ_p$ having a composition closest to that of Si and present in an equilibrium state.

The C concentration ratio Q(C) lower than the abovementioned lower limits would result in less effective reduction in the activity of the surface of the negative electrode material particles of the present invention, so in this case the reactivity with an electrolyte solution cannot be suppressed and favorable charge/discharge cycle properties cannot be achieved. On the other hand, the C concentration ratio Q(C) higher than the abovementioned upper limits would result in the formation of the stable compound present in an equilibrium state, SiC, which may reduce the conductivity of the negative electrode and make it difficult to dope/dedope lithium ions. In this case, charge/discharge of the battery may be impossible.

Composition when the Element Z is N

When the element Z is N, the abovementioned Z concentration ratio Q(Z) (hereinafter it may be referred to as "the N concentration ratio Q(N)") is typically 0.15 or higher, preferably 0.30 or higher, and more preferably 0.40 or higher, as well as is typically 0.90 or lower, preferably 0.70 or lower, and more preferably 0.65 or lower. As described earlier, when the element Z is N, SiN is the compound $Si_aZ_p$ having a composition closest to that of Si and present in an equilibrium state.

The N concentration ratio Q(N) lower than the abovementioned lower limits would result in less effective reduction in the activity of the surface of the negative electrode material particles of the present invention, so in this case the reactivity with an electrolyte solution cannot be suppressed and favorable charge/discharge cycle properties cannot be achieved. On the other hand, the N concentration ratio Q(N) higher than the abovementioned upper limits would result in the formation of stable compounds present in an equilibrium state, such as $Si_3N_4$, which may reduce the conductivity of the negative electrode and make it difficult to dope/dedope lithium ions. Also in this case, charge/discharge of the battery may be impossible.

Composition when Another Element M is Contained

When the compound $SiZ_xM_y$ contains an element M and is expressed by the formula $SiZ_xM_y$, the composition ratio y of the element M in the compound $SiZ_xM_y$ is preferably in the range of 0.08 to 0.5, and more preferably in the range of 0.10 to 0.4.

The composition ratio y of the element M higher than the abovementioned upper limits would result in a low content of Si, and this makes difficult to provide the battery with a high capacity and thus is not preferable. Meanwhile, when the element M is not included in the compound, the composition ratio y of the element M is equal to or nearly equal to zero. In the present invention, the composition ratio y being nearly equal to zero means the element M being unavoidably added into the negative electrode material particles of the present invention during the production process thereof (the content of the element M is substantially zero), and in this case the value of y is, for example, less than 0.08.

[Structure of the Negative Electrode Material Particles]

Examples of the structure of the negative electrode material particles of the present invention include:

i) a structure that has the layer of the compound $SiZ_xM_y$ formed on the surface of the negative electrode material particles containing Si; and/or II) a structure in which the negative electrode material particles exist as the compound $SiZ_xM_y$ in which the atoms of the element Z are dispersed in Si particles. Preferably, the negative electrode material particles of the present invention are solely in the structure II).

Here, the negative electrode material particles containing Si described in the structure I) represent the particles of pure Si or of an Si-containing compound other than $SiZ_x$.

<Distribution Profile of the Element Z in the Compound $SiZ_xM_y$>

The element Z in the compound $SiZ_xM_y$, which the negative electrode material particles of the present invention have at least on the surface thereof, takes a form having a dimension equal to or less than 500 nm, such as atoms, molecules and clusters. The element Z is preferably uniformly distributed in the compound $SiZ_xM_y$, and more preferably, distributed in such a manner that the concentration gradient of the element Z increases from the core of each particle of the negative electrode material toward the surface. If the element Z is distributed nonuniformly in the $SiZ_xM_y$ layer on the surface of the negative electrode material particles of the present invention, in other words, if some atoms of the element Z are localized, the reduction in the activity of the surface of the negative electrode material of the present invention is also nonuniform and the reactivity with an electrolyte solution cannot be suppressed, and as a result, it may be difficult to achieve favorable charge/discharge cycle properties. In addition, the distribution profile can be determined by EPMA measurement, XPS measurement or other means as described in the examples later.

When the compound $SiZ_xM_y$ contains the element M, the distribution profile of the element M in the compound $SiZ_xM_y$ is not particularly limited, and the element M may be distributed uniformly or nonuniformly.

<Existence Status of the Element Z in Si>

In the negative electrode material particles of the present invention, the existence status of the element Z in Si is preferably one in which the XPsz value obtained in X-ray diffraction measurement is 2.5 or lower, and more preferably, one in which the XPsz value is 2.0 or lower. The reason why these ranges are preferable is that the XPsz value being not higher than these upper limits means that the main component of the system is not a compound present in an equilibrium state such as $Si_aZ_p$ but is the phase in which the element Z exists in Si in a non-equilibrium state. If the XPsz value is higher than these upper limits, more specifically, if the main component of the system is the phase of the compound present in an equilibrium state such as $Si_aZ_p$, the activity of Si is not reduced and the reactivity with an electrolyte solution cannot be suppressed resulting in poor charge/discharge cycle properties, and the presence of the low-conductivity compound such as $Si_aZ_p$ may degrade the conductivity of the negative electrode and make it difficult to dope/dedope lithium ions, thus leading to the impossibility of charge/discharge of the battery. The lower limit of the XPsz value is typically 0.00 or higher.

When the element Z is C, the XPsz value measured using X-ray diffraction is preferably 1.20 or lower and more preferably 0.70 or lower, but not particularly limited to these ranges, and when the element Z is N, the XPsz value is preferably 1.10 or lower and more preferably 1.00 or lower. The XPsz value higher than these upper limits, in other words, a large content of silicon carbide in the case the element Z is C or a large content of silicon nitride in the case the element Z is N, may result in the lowered discharge capacity per unit weight of the active substance.

In addition, the XPsz value of the negative electrode material particles is calculated using X-ray diffraction according to the following X-ray diffraction measurement method, and defined as follows.

[Method of X-ray Diffraction Measurement]

In X-ray diffraction measurement, the XPsz value of the negative electrode material particles can be determined by, for example, using an X-ray diffractometer (e.g., "X-ray Diffractometer" manufactured by Rigaku Corporation) with the negative electrode material particles of the present invention being set on the irradiation stage. The measurement conditions are described in the examples later. The XPsz value is defined as follows.

XPsz Value when the Element Z is C

The XPsz value of the negative electrode material particles is defined as the intensity ratio XPsz calculated from the measured peak intensity Isz with 2θ set at 35.7° and the measured peak intensity Is with 2θ set at 28.4° (XPsz=Isz/Is). Here, the peaks observed with 2θ set at 35.7° and 28.4° are considered the peaks assigned to SiC and silicon, respectively, and the XPsz value being 1.20 or lower means that little amount of SiC is detected.

XPsz Value when the Element Z is N

The XPsz value of the negative electrode material particles is defined as the intensity ratio XPsz calculated from the measured peak intensity Isz with 2θ set at 70.2° and the measured peak intensity Is with 2θ set at 28.4° (XPsz=Isz/Is). Here, the peaks observed with 2θ set at 27.1° and 28.4° are considered the peaks assigned to $Si_3N_4$ and silicon, respectively, and the XPsz value being 1.10 or lower means that little $Si_3N_4$ is detected.

<Thickness of the Layer of the Compound $SiZ_xM_y$>

In the structure I) described earlier, the thickness of the layer of the compound $SiZ_xM_y$, which the negative electrode material particles containing Si have at least on the surface thereof, from the surface of each particle is typically 100 nm or more, preferably 200 nm or more, more preferably 300 nm or more, and most preferably 500 nm or more. The thickness of the layer of the compound $SiZ_xM_y$ lower than these lower limits would result in less effective reduction in the activity of the surface of the negative electrode material particles of the present invention, so in this case the reactivity with an electrolyte solution cannot be suppressed and favorable charge/discharge cycle properties cannot be achieved. In addition, the thickness of the layer of the compound $SiZ_xM_y$ can be determined by EPMA measurement, XPS measurement or other means.

[Other Physical Properties]

<Volume Average Particle Diameter>

The volume average particle diameter of the negative electrode material particles of the present invention is typically 0.1 μm or larger, preferably 1 μm or larger, and more preferably 3 μm or larger, as well as is typically 30 μm or smaller, preferably 20 μm or smaller, and more preferably 15 μm or smaller, but is not particularly limited to these ranges. If the volume average particle diameter of the negative electrode material particles is smaller than these lower limits, such an excessively small particle diameter may make it difficult to ensure the conductive paths between the negative electrode material particles and between each particle of the negative electrode material and a conductive agent or a negative electrode material A, described later, thereby degrading the charge/discharge cycle properties. On the other hand, the volume average particle diameter higher than the upper limits would often result in unevenness of the layer of the negative electrode active substance formed on current collectors in a manner described later.

The volume average particle diameter may be an average particle diameter based on volume (median diameter) measured using a laser-diffraction particle size distribution analyzer (e.g., "LA-920" manufactured by HORIBA, Ltd.) with the measurement object mixed with a 2-volume-percent aqueous solution (approximately 1 mL) of polyoxyethylene (20) sorbitan monolaurate, a surfactant, being dispersed in ion-exchange water. In the examples described later, this method was used to obtain the volume average particle diameter.

<BET Specific Surface Area>

The BET specific surface area of the negative electrode material particles of the present invention is typically 0.5 $m^2/g$ or larger and preferably 1.0 $m^2/g$ or larger, as well as is typically 50 $m^2/g$ or smaller, preferably 30 $m^2/g$ or smaller, and more preferably 10 $m^2/g$ or smaller, but is not particularly limited to these ranges. The negative electrode formed of particles having a BET specific surface area smaller than these lower limits is often poor in lithium-occluding performance during charge of the battery, and in some cases, is likely to separate lithium out on the surface thereof. On the other hand, the negative electrode formed of particles having a BET specific surface area larger than these upper limits would exhibit a high reactivity with an electrolyte solution. This may promote the generation of gas, thus making it difficult to make a favorable battery.

The BET specific surface area may be a value obtained in measurement using a surface area analyzer (e.g., a fully-automated surface area analyzer manufactured by OHKURA RIKEN, Inc.), in which the negative electrode material particles dried under nitrogen flow at 350° C. for 15 minutes in advance are evaluated for nitrogen absorption following a BET one-point method based on a gas flow method using a nitrogen-helium mixed gas that has been adjusted so that the nitrogen pressure relative to atmospheric pressure is exactly 0.3.

<Tap Density>

The tap density of the negative electrode material particles of the present invention is typically 0.2 $g/cm^3$ or higher, preferably 0.3 $g/cm^3$ or higher, and more preferably 0.5 $g/cm^3$ or higher, as well as is typically 3.5 $g/cm^3$ or lower, and preferably 2.5 $g/cm^3$ or lower, but is not particularly limited to these ranges. The tap density lower than these lower limits would make it difficult to achieve a high packing density of the layer of the negative electrode active substance, thereby leading to the difficulty in obtaining a high-capacity battery. On the other hand, the tap density higher than these upper limits would result in that the electrode has a reduced number of pores, thus leading to the difficulty in achieving favorable battery properties.

The tap density may be a value obtained through, for example, measurement in which the negative electrode material particles are sieved through a sieve having a mesh size of 300 μm into a 20-$cm^3$ tapping cell until the cell is filled and then the cell is tapped 1000 times in a particle densitometer (e.g., TAP DENSER manufactured by Seishin Enterprise Co., Ltd.) with the stroke set at 10 mm.

<Raman RPC, Raman RPSC, Raman RPS and Raman RPSN Values>

In the negative electrode material particles of the present invention, the Raman RPC value measured by Raman spectrometry is preferably 2.0 or lower, more preferably 1.0 or lower, and most preferably 0.5 or lower. The Raman RPC value higher than these upper limits would make it difficult to ensure the effect of improving the battery capacity thanks to the presence of Si. The lower limit of the Raman RPC value is usually 0.0 or higher for analytical reasons.

In the negative electrode material particles of the present invention, the Raman RPSC value measured by Raman spectrometry is preferably 0.25 or lower, and more preferably 0.20 or lower. The Raman RPSC value higher than these upper limits would result in the reduced conductivity and the difficulty in doping/dedoping lithium ions, and this may make charge/discharge of the battery impossible. The lower limit of the Raman RPSC value is usually 0.0 or higher for analytical reasons.

In the negative electrode material particles of the present invention, the Raman RPS value measured by Raman spectrometry is, when the element Z is C, preferably 0.30 or higher, and more preferably 0.40 or higher, as well as preferably 0.75 or lower, and more preferably 0.65 or lower. When the element Z is N, the Raman RPS value is preferably 0.30 or higher, and more preferably 0.40 or higher, as well as preferably 1.00 or lower, and more preferably 0.9 or lower. The Raman RPS value lower than these lower limits would result in poor charge/discharge cycle properties. On the other hand, the Raman PRS value higher than these upper limits would make charge/discharge of the battery impossible.

In the negative electrode material particles of the present invention, the Raman RPSN value measured by Raman spectrometry is preferably 0.9 or lower, and more preferably 0.8 or lower. The Raman RPSN value higher than these upper limits would result in the reduced conductivity and the difficulty in doping/dedoping lithium ions, and this may make charge/discharge of the battery impossible. The lower limit of the Raman RPSN value is usually 0.0 or higher for analytical reasons.

In addition, the Raman RPC, Raman RPSC, Raman RPS, Raman RPSN values based on Raman spectrometric analysis for the negative electrode material particles of the present invention can be determined by the Raman spectrometric analysis according to the following method of Raman measurement, and are respectively defined as described later.

Method of Raman Measurement

Using a Raman spectrometer (e.g., "Raman Spectrometer" manufactured by JASCO Corporation), measurement is carried out by putting the negative electrode material particles of the present invention into a measurement cell, and then exposing the surface of the sample contained in the cell to an argon ion laser beam while rotating the cell. After the measurement, the obtained spectra are corrected for the background thereof so as to provide the Raman RPC, RPSC, RPS and RPSN values described below. In addition, the correction of the background is made by subtracting the background intensity, which is determined by drawing a line between the start and the end of a peak, from the intensity of the peak.

The conditions of the Raman measurement are as follows. The spectrum is smoothed using a simple average of 15 points of convolution.

Wavelength of argon ion laser: 514.5 nm
Laser power on the sample: 15 to 40 mW
Resolution: 10 to 20 $cm^{-1}$
Measurement range: 200 to 1900 $cm^{-1}$
Exposure time: 30 to 300 sec.
Number of integrations: 3
Raman RPC Value The Raman RPC value of the negative electrode material particles is defined as the intensity ratio RPC of the intensity Ic of the peak c observed at wavelengths in the range of approximately 1300 to 1600 $cm^{-1}$ to the intensity Ias of another peak as observed at wavelengths in the range of approximately 300 to 500 $cm^{-1}$ (RPC=Ic/Ias) The peaks c and as are considered to be derived from carbon and silicon, respectively. Therefore, the Raman RPC value represents the quantity of carbon and the Raman RPC value being 2.0 or lower means that little amount of carbon is detected.

Raman RPSC Value

The Raman RPSC value of the negative electrode material particles is defined as the intensity ratio RPSC of the intensity Isc of the peak sc observed at wavelengths in the range of approximately 650 to 850 cm$^{-1}$ to the intensity Ias of another peak as observed at wavelengths in the range of approximately 300 to 500 cm$^{-1}$ (RPSC=Isc/Ias) The peaks so and as are considered to be derived from SiC and silicon, respectively. Therefore, the Raman RPSC value represents the quantity of SiC and the Raman RPSC value being 0.25 or lower means that little amount of SiC is detected.

Raman RPS Value

The Raman RPS value of the negative electrode material particles is defined as the intensity ratio RPS of the intensity Is measured at a wavelength of 520 cm$^{-1}$ to the intensity Ias of another peak as observed at wavelengths in the range of approximately 300 to 500 cm$^{-1}$ (RPS=Is/Ias). The Raman RPS value represents the status of Si.

Raman RPSN Value

The Raman RPSN value of the negative electrode material particles is defined as the intensity ratio RPSN of the intensity Isn of the peak sn observed at wavelengths in the range of approximately 700 to 1000 cm$^{-1}$ to the intensity Ias of another peak as observed at wavelengths in the range of approximately 300 to 500 cm$^{-1}$ (RPSN=Isn/Ias) The peaks sn and as are considered to be derived from silicon nitride and silicon, respectively. Therefore, the Raman RPSN value represents the quantity of silicon nitride and the Raman RPSN value being 0.9 or lower means that little amount of silicon nitride is detected.

[Production Method]

The method for producing the negative electrode material particles of the present invention is not particularly limited. The production method may be, for example, the method described below.

<Materials>

As one of the materials of the negative electrode material particles (hereinafter, they may be abbreviated to "materials"), the Si material may be crystalline Si, amorphous Si, silicon compounds (such as silicon nitride and silicon carbide) or the like. As the material of Z, elements C and N can be used independently or in combination with each other. Examples of the material of the element C include naturally-occurring graphite, artificial graphite, amorphous carbon and carbides, and examples of the material of the element N include nitrides. In the case where gases used as the materials, examples of the material of the element C include carbon-containing gases (such as $CH_4$, $C_2H_6$ and $C_3H_8$), and examples of the material of the element N include nitrogen-containing gases (such as $NH_3$ and $N_2$).

The materials of Si and the element Z may be in the form of a single compound (or a single element) consisting of Si and the element Z or in the form of individual compounds.

When the compound $SiZ_xM_y$ contains the element M, the element M is defined as descried earlier. Here it should be noted that Si, the element Z and the element M may be used in the form of a single compound consisting of them or in the form of individual compounds. In addition, these materials of Si, the element Z and the element M may be used in the physical form of particles, granules, pellets, clusters, plates or the like.

<Process>

Examples of the process for producing the negative electrode material particles include the following 1) to 5).

1) The process in which the element Z is allowed to react with the surface of Si-containing particles so as to form the dispersion layer of the element Z inside each particle (formation of the structure I) or II))

2) The process in which the surface of each Si-containing particle is coated with the layer of $SiZ_xM_y$ by a gas-phase film-forming method such as vapor deposition, CVD or sputtering (formation of the structure I))

3) The process in which a substrate is coated with the layer of a material containing Si and the element Z by a gas-phase film-forming method such as vapor deposition, CVD or sputtering and then the formed film is ground (formation of the structure II))

4) The process in which a material containing Si and the element Z is fused and then rapidly quenched until the material is solidified (formation of the structure II))

5) The process in which the a fused salt containing Si and the element Z is electrolyzed (formation of the structure II))

In any of these processes, when the compound $SiZ_xM_y$ contains the element M, the material of the element M may be additionally used. However, in the case where the element M is oxygen (O), it may be supplied by the atmosphere in the production process. The production processes 1) to 5) are explained in detail below.

1) The Process in which the Dispersion Layer of the Element Z is Formed Inside Si-Containing Particles Examples of the method for forming the dispersion layer of the element Z include the following methods i) to iii).

i) The Si-containing particles are heat-treated under the atmosphere containing the element Z so that the element Z is dispersed in the Si-containing particles.

ii) The Si-containing particles and other particles containing the element Z are heat-treated in vacuum or under the atmosphere of an inert gas, such as Ar, while being in contact with each other so that the element Z is dispersed in the Si-containing particles.

iii) The Si-containing particles are exposed to the element Z that has been ionized by plasma treatment or other means so that the element Z is dispersed in the Si-containing particles.

2) The Process in which the Surface of Each Si-Containing Particle is Coated with the Layer of $SiZ_xM_y$ Examples of the gas-phase film-forming method for applying an $SiZ_xM_y$ coating include the following methods iv) to vi).

iv) Vapor deposition
v) CVD
vi) Sputtering

Procedures for applying an $SiZ_xM_y$ coating according to the methods iv) to vi) are respectively described below.

iv) Vapor Deposition

The vapor deposition method is a method in which the layer of $SiZ_xM_y$ is formed on the Si-containing particles by fusing/vaporizing the abovementioned material and then depositing the vapor thereof, and this method has, in general, an advantage of forming a thin film faster than the sputtering method does. When compared to the sputtering method, the vapor deposition method, which can reduce the time required for forming the active substance, can be favorably used in terms of production cost. Specific examples of this method include induction heating, resistance heating and electron-beam-heating vapor deposition. To heat-fuse and vaporize a vapor deposition material for forming a thin film, the induction heating approach applies induced current to a vapor deposition crucible formed of graphite or another similar material, the resistance heating approach applies heating current to an energized vapor deposition boat, and the electron-beam-heating vapor deposition approach utilizes an electron beam.

The vapor deposition method is usually carried out in vacuum. In addition, when the element Z contained in the compound $SiZ_xM_y$ is N, it is also possible to form $SiZ_xM_y$ simultaneously in vacuum after reducing the pressure by introducing a little amount of nitrogen gas together with an inert gas. To avoid contamination of impurities, the maximum degree of vacuum in a chamber at the start of the film-forming process is usually 0.1 Pa or lower. During the formation of the layer of $SiZ_xM_y$ in the vapor deposition method, the temperature of the particles can be controlled using a heater or other means. In general, the temperature of the particles is in the range of room temperature to 900° C. The film-forming rate of the formation of the layer of $SiZ_xM_y$ in the vapor deposition method is usually in the range of 0.1 to 50 µm/min.

v) CVD

In the CVD method, the layer of $SiZ_xM_y$ is formed through chemical reaction of the material described later in a gas phase followed by the deposition thereof on the Si-containing particles. In general, the CVD method controls the gas of a compound in a reaction chamber using a gas flow, and thus can synthesize a wide variety of materials at a high level of purity. Specific examples of this method include thermal CVD, plasma CVD, photo-CVD and cat-CVD. The thermal CVD approach forms a thin film through a thermochemical reaction initiated by introducing the gas of a halogen material, which exhibits a high vapor pressure, into a reaction chamber heated to a temperature around 1000° C. together with a carrier gas and a reaction gas. The plasma CVD approach uses plasma instead of the thermal energy, and the photo-CVD approach uses light energy instead of the thermal energy. The cat-CVD represents catalytic chemical vapor deposition, in which a catalytic cracking reaction between a material gas and a heat-activated catalyst is utilized to form a thin film.

Examples of the material gas used in such a CVD method include one compound or two or more compounds selected from $SiH_4$, $SiCl_4$ and others as the source of the element Si, one compound or two or more compounds selected from $NH_3$, $N_2$ and others as the source of the element Z, and one compound or two or more compounds selected from $CH_4$, $C_2H_6$, $C_3H_8$ and others.

vi) Sputtering

In the sputtering method, the layer of $SiZ_xM_y$ is formed by using plasma at a reduced pressure to allow the subject matter released from the target formed of the abovementioned material to collide against the surface of each Si-containing particle for deposition. The sputtering method provides a good interfacial state between the resulting layer of $SiZ_xM_y$ and the particles. As the sputtering voltage applied to the target, any of direct and alternating voltage may be used.

To avoid contamination of impurities, the maximum degree of vacuum in a chamber at the start of forming the $SiZ_xM_y$ layer is usually 0.1 Pa or lower. As the sputtering gas, an inert gas such as Ne, Ar, Kr and Xe is used. In particular, an argon gas is preferable in terms of the sputtering efficiency and other properties. Also, when the element Z contained in the layer of $SiZ_xM_y$ is N, it is preferable, for manufacturing reasons, that the element Z is contained at a little amount in the abovementioned inert gas. The pressure of the sputtering gas is usually in the range of 0.05 to approximately 70 Pa.

During the formation of the layer of $SiZ_xM_y$ in the sputtering method, the temperature of the particles can be controlled using water, a heater or other means. In general, the temperature of the particles is in the range of room temperature to 900° C. The film-forming rate of the formation of the layer of $SiZ_xM_y$ in the sputtering method is usually in the range of 0.01 to 0.5 µm/min.

3) The Process in which the $SiZ_xM_y$ Compound-Containing Film Obtained in Gas-Phase Film-Forming is Ground As the gas-phase film-forming method for forming a film containing the compound $SiZ_xM_y$, a gas-phase film-forming method similar to that used in the abovementioned process (2) is used. However, the substrate used to form a film is a board made of a metal such as SUS, copper and aluminum, or a ceramic such as alumina and zirconia instead of the particles containing Si. The $SiZ_xM_y$ compound-containing film formed on the substrate is removed from the substrate and ground, and then, if needed, classified by size so as to provide the negative electrode material particles.

Examples of the grinding apparatus include, but are not particularly limited to, a rough grinder such as a jaw crusher, an impact crusher and a cone crusher, an intermediate grinder such as a roll crusher and a hammer mill, and a fine grinder such as a ball mill, an oscillating mill, a pin mill, a stirring mill and a jet mill.

Examples of the apparatus used in the classification process include, but are not particularly limited to, a rotary sieve, a rocking sieve, a turning sieve, a vibrating sieve: for dry classification, a gravity-based classification apparatus, an inertial-force-based classification apparatus and a centrifugal-force-based classification apparatus (e.g., Classifier, Cyclone, or the like): for dry and air-flow classification, and a mechanical wet-classification apparatus, a hydraulic classification apparatus, a precipitation classification apparatus and a centrifugal-force-based wet-classification apparatus: for wet classification.

4) The Process in which a Material Containing Si, the Element Z and the Element M in the Composition Expressed By $SiZ_xM_y$ is Fused and then Rapidly Quenched Until the Material is Solidified The method for fusing, rapidly quenching and solidifying such a material for forming the negative electrode material particles includes the following methods vii) and viii).

vii) The method in which a plate, a wire or particles is/are first formed and then ground viii) The method in which the material is directly processed into particles without being ground.

The methods vii) and viii) are respectively described below.

vii) The Method in which a Plate, a Wire or Particles is/are First Formed and then Ground Examples of the method for producing a plate by rapid quenching and solidification include a roller method (a roller spinning method or a twin-roller spinning method), a direct casting and rolling method, a melt drag method. Also, examples of the method for producing a wire by rapid quenching and solidification include an in-rotating-liquid spinning method. Furthermore, examples of the method for forming particles by rapid quenching and solidification include a centrifugal spraying method, a rotating-liquid spraying method, a rotating electrode method, a gas-spraying splat method, a melt extraction method and a melt spinning method.

Grinding is performed using an apparatus similar to one used in the abovementioned process 3) after rapid quenching and solidification. After the grinding step, classification by size may be carried out, if desired. In this case, the type of classification apparatus is similar to one for the abovementioned process 3).

viii) The Method in which the Material is Directly Processed into Particles without being Ground In this method, the particles having a diameter close to the target diameter of the negative electrode material particles are directly formed during the rapid quenching and solidification step, and examples of such a method include a particle-forming method similar to that described in vii) above. After the rapid quenching and solidification step, classification by size may be carried out using a classification apparatus similar to one used in the abovementioned process 3), if desired.

5) The Process in which a Fused Salt Containing Si, the Element Z and the Element M in the Composition Expressed By $SiZ_xM_y$ is Electrolyzed A specific example of this method is plasma-induced cathode electrolysis of a fused salt containing Si, the element Z and the element M in the composition expressed by $SiZ_xM_y$ for producing the negative electrode material particles. In such a method, a salt containing Si and another salt containing the element Z can be used as materials.

[2] Negative Electrode for a Nonaqueous Electrolyte Rechargeable Battery

The negative electrode for a nonaqueous electrolyte rechargeable battery according to the present invention uses the negative electrode material particles of the present invention as the negative electrode active substance, and is made, in general, in such a manner that the layer of the negative electrode active substance containing the negative electrode material particles of the present invention is formed on a current collector so as to have conductivity.

The negative electrode according to the present invention made in the abovementioned manner is extremely useful as a negative electrode used in a nonaqueous electrolyte rechargeable battery such as a lithium rechargeable battery that consists of positive and negative electrodes capable of occluding/releasing lithium ions and an electrolyte. For example, the nonaqueous electrolyte rechargeable battery configured in the combination of the negative electrode of the present invention, a commonly used metal-chalcogenide-based positive electrode for a lithium rechargeable battery, and an organic electrolyte solution mainly constituted of a carbonate solvent exhibits a large capacity, a small irreversible capacity found during an initial charge/discharge cycle, excellent charge/discharge cycle properties, suppressed electrode expansion in volume after charge/discharge cycles, favorable stability and reliability even when left under high-temperature conditions, and extremely excellent high-efficiency-discharging properties and low-temperature discharging properties.

[Negative Electrode Active Substance]

Although the negative electrode material particles of the present invention are used to form the negative electrode active substance according to the present invention, an additional negative electrode material other than the negative electrode material particles of the present invention (hereinafter, referred to as "negative electrode material A") may be mixed with the negative electrode material particles, as long as the negative electrode material A does not interfere with the effects of the present invention. In the case where the negative electrode material A is used, any material that can occlude/release lithium ions may be used as the negative electrode material A. Examples of the negative electrode material A include graphite such as naturally-occurring graphite (e.g., graphite scales and graphite spheres) and artificial graphite (e.g., mesocarbon microbeads), amorphous carbon obtained by calcinating pitch, resin or the like, multi-phase structure materials obtained by combining graphite and amorphous carbon, metals such as aluminum and tin, and oxides such as SiO. Among these types of negative electrode material A, the naturally-occurring graphite, the artificial graphite, and the multi-phase structure materials obtained by combining graphite and amorphous carbon are preferably used because they are inexpensive, easy to handle and currently widely used in industry. These materials may be used separately or in combination of two or more kinds.

The amount of the negative electrode material A added into the negative electrode material particles of the present invention is typically 15 wt % or higher, preferably 30 wt % or higher, more preferably 40 wt % or higher and most preferably 50 wt % or higher, as well as is typically 95 wt % or lower, preferably 90 wt % or lower and more preferably 85 wt % or lower, but is not particularly limited to these ranges.

<Thickness of the Negative Electrode Active Substance>

The thickness of the negative electrode active substance is typically 1 μm or larger and preferably 5 μm or larger, as well as is typically 100 μm or smaller and preferably 60 μm or smaller, but is not particularly limited to these ranges. The negative electrode active substance having a thickness smaller than these lower limits would reduce the capacity per negative electrode according to the present invention, so that a large number of negative electrodes are required for producing a high-capacity battery. This causes the total volume of required positive electrodes, separators and current collectors to be accordingly increased, and thus the amount of the negative electrode active substance that the unit volume of the battery can contain is substantially decreased. It may therefore be difficult to improve the battery capacity. On the other hand, the thickness of the negative electrode active substance larger than the upper limits described above would reduce the charge/discharge capacity at high current densities. In this case, it may be difficult to achieve favorable battery properties.

[Current Collector]

Examples of the current collector include a metal column, a metal coil, a metal plate, a metal film, a carbon plate, a carbon film and a carbon column. In particular, the metal film is currently used in industrial products, thus being preferable. In addition, the metal film may be processed into a mesh before use, if desired.

The thickness of the metal film is typically 1 μm or larger, preferably 5 μm or larger and more preferably 10 μm or larger, as well as is typically 100 μm or smaller, preferably 50 μm or smaller and more preferably 20 μm or smaller, but is not particularly limited to these ranges. The metal film having a thickness smaller than these lower limits would be lacking in integrity necessary to be a current collector.

Furthermore, specific examples of metals used for forming the current collector include copper, nickel, stainless steel, iron, titanium and aluminum. Among these metals, copper and nickel are preferable, with copper being more preferable. This is because it is easy to bind the negative electrode active substance to copper, and to change the shape and the size thereof in industrial applications.

[Physical Properties]

<Packing Density>

The packing density of the negative electrode is typically 0.5 g/cm$^3$ or larger and preferably 0.7 g/cm$^3$ or higher, as well as is typically 2.5 g/cm$^3$ or smaller and preferably 2.0 g/cm$^3$ or smaller, but is not particularly limited to these ranges. The negative electrode having a packing density lower than these lower limits would lead to the difficulty in producing a high-capacity battery. On the other hand, the negative electrode having a packing density higher than the upper limits described above would have a reduced number of pores, thus hardly achieving favorable battery properties.

In addition, as the packing density of the negative electrode, the value calculated by dividing the weight of the negative electrode excluding the current collector by the area and the thickness of the negative electrode may be used.

<Porosity>

The porosity of the negative electrode is typically 10% or higher and preferably 20% or higher, as well as is typically 50% or lower and preferably 40% or lower, but is not particularly limited to these ranges. The negative electrode exhibiting porosity lower than these lower limits would have a reduced number of pores, and this inhibits the penetration of the electrolyte solution. In this case, it may be difficult to achieve favorable battery properties. On the other hand, the negative electrode exhibiting porosity higher than the upper limits described above would have an excessive number of pores, and this causes the integrity of the negative electrode to be excessively low. Also in this case, it may be difficult to achieve favorable battery properties.

In addition, as the porosity of the negative electrode, the percentage of the value calculated by dividing the total pore volume of the negative electrode obtained in pore distribution measurement using a mercury porosimeter by the apparent volume of the layer of the negative electrode active substance excluding the current collector may be used.

[Structure and Production Method]

The structure of the negative electrode and the production method thereof are not particularly limited. However, examples of the structure of the negative electrode include the followings.

A: The structure in which the negative electrode active substance containing the negative electrode material particles of the present invention, a conductive agent, which is used as needed, and an organic substance having binding and thickening effects (hereinafter, referred to as "a binding agent") are applied on a current collector B: The structure in which particles obtained by combining the negative electrode active substance containing the negative electrode material particles of the present invention with a conductive substance and a binding agent are applied on a current collector C: The structure in which the negative electrode active substance containing the negative electrode material particles of the present invention is sintered together with a current collector in the presence of a sintering agent D: The structure in which the negative electrode active substance containing the negative electrode material particles of the present invention is combined with a current collector through bonds to a low-melting-point metal E: The structure in which the negative electrode active substance containing the negative electrode material particles of the present invention is combined with a current collector without using any binding component The negative electrode structures A to E and the production method thereof are described below.

A: The structure in which the negative electrode active substance, a conductive agent, which is used as needed, and a binding agent are applied on a current collector This structure is made by forming the layer of the negative electrode active substance obtained by mixing the negative electrode material particles of the present invention with the negative electrode material A and/or a conductive agent and a binding agent on a current collector <Conductive Agent>

The layer of the negative electrode active substance may contain a conductive agent. Any kind of electron-conducting material may be used as the conductive agent as long as the material is not involved in chemical reactions at the charge/discharge potential of the negative electrode active substance to be used. For example, several types of carbon black such as acetylene black, Ketjen black, channel black, furnace black, lamp black and thermal black, several kinds of conductive fiber such as carbon fiber, vapor-grown carbon fiber (VGCP) and metal fiber, or metal particles of carbon fluoride, copper or the like may be contained separately or in combination with each other. Among these conductive agents, acetylene black and VGCF are particularly preferable. These agents may be used separately or in combination of two or more kinds.

The amount of the conductive agent added into the negative electrode active substance is preferably in the range of 1 to 30 wt %, and more preferably in the range of 1 to 15 wt %, but is not particularly limited to these ranges.

<Binding Agent>

A preferred binding agent is polymer that is stable in a liquid solvent described later. Examples of such polymer include resin polymer such as polyethylene, polypropylene, polyethylene terephthalate, aromatic polyamide and cellulose, rubbery polymer such as styrene-butadiene rubber, isoprene rubber, butadiene rubber and ethylene-propylene rubber, thermoplastic elastomeric polymer such as styrene-butadiene-styrene block copolymer and the hydrogenated product thereof, styrene-ethylene-butadiene-styrene copolymer and styrene-isoprene-styrene block copolymer and the hydrogenated product thereof, flexible resin polymer such as syndiotactic 1,2-polybutadiene, ethylene-vinyl acetate copolymer, and propylene-α-olefin (having two to twelve carbon atoms) copolymer, fluorinated polymer such as polyvinylidene fluoride, polytetrafluoroethylene and polytetrafluoroethylene-ethylene copolymer, as well as a polymer composition that has ion conductivity for alkali metal ions (in particular, lithium ions). These polymer substances may be used separately or in combination of two or more kinds.

As the abovementioned polymer composition that has ion conductivity, polyether-based polymer compounds such as polyethylene oxide and polypropylene oxide, cross-linked polymer of a polyether compound, a polymer compound obtained by adding a lithium salt or an alkali metal salt mainly constituted of lithium into polyepichlorohydrin, polyphosphazene, polysiloxane, polyvinylpyrrolidone, polyvinylidene carbonate, polyacrylonitrile or another polymer compound, or a polymer substance obtained by mixing such a polymer compound with an organic compound having a high dielectric constant or a high ion-dipole interaction force, such as propylene carbonate, ethylene carbonate and γ-butyrolactone, may be used.

More specifically, typical examples of such a polymer composition include resin polymer such as polyethylene, polypropylene, polyethylene terephthalate, aromatic polyamide, polyimide, cellulose and derivatives thereof (e.g., carboxymethyl cellulose), rubbery polymer such as styrene-butadiene rubber, isoprene rubber, butadiene rubber and ethylene-propylene rubber, fluorinated polymer such as polyvinylidene fluoride, polytetrafluoroethylene and polytetrafluoroethylene-ethylene copolymer, polyether-based polymer compounds such as polyethylene oxide and polypropylene oxide, and cross-linked polymer of a polyether compound, preferred examples of such a polymer composition include polyethylene, polypropylene, polyimide, styrene-butadiene rubber, polyvinylidene fluoride, polytetrafluoroethylene and polyethylene oxide, and more preferred examples of such a polymer composition include polyethylene, styrene-butadiene rubber, polyvinylidene fluoride and polytetrafluoroethylene. These compounds are currently widely used in industry and easy to handle, thus being preferably used as such a polymer composition.

The negative electrode taking this structure is produced through the step of applying a slurry obtained by dispersing the negative electrode material particles of the present invention, the negative electrode material A and/or a conductive agent and a binding agent in a dispersion medium on a current collector substrate so as to be a thin layer and drying the thin layer, and the subsequent pressing step of pressing the dried layer until it has a predetermined thickness and a predetermined density.

In the preparation of the slurry of negative electrode active substance, which is prepared by mixing the negative electrode active substance, a conductive agent, which is used as needed, and a binding agent and is then applied on a current collector, an aqueous solvent or an organic solvent is used as the dispersion medium. Although water is typically used as the aqueous solvent, an additive such as ethanol or other alcohols and N-methylpyrrolidone or other cyclic amides may be added into water as long as the concentration of the additive is not more than approximately 30 wt %.

Typical examples of the organic solvent include cyclic amides such as N-methylpyrrolidone, linear amides such as N,N-dimethylformamide and N,N-dimethylacetamide, aromatic hydrocarbons such as anisole, toluene and xylene, and alcohols such as butanol and cyclohexanol. Among these solvents, cyclic amides such as N-methylpyrrolidone and linear amides such as N,N-dimethylformamide and N,N-dimethylacetamide are preferable.

The layer of the negative electrode active substance is formed through the step of preparing the slurry of the negative electrode active substance by mixing the negative electrode active substance, a conductive agent, which is used as needed, and a binding agent, and the subsequent step of applying this slurry on a current collector substrate for a negative electrode so as to have a predetermined thickness. The upper limit of the concentration of the negative electrode active substance in the slurry of the negative electrode active substance is typically 70 wt % or lower and preferably 55 wt % or lower, whereas the lower limit thereof is typically 30 wt % or higher and preferably 40 wt % or higher. In the slurry of the negative electrode active substance containing the negative electrode active substance at a concentration higher than these upper limits, the negative electrode active substance is likely to aggregate. On the other hand, the concentration lower than the lower limits described above would result in the negative electrode active substance being likely to precipitate during the storage of the slurry of the negative electrode active substance.

The upper limit of the concentration of a binding agent in the slurry of the negative electrode active substance is typically 30 wt % or lower and preferably 10 wt % or lower, whereas the lower limit thereof is typically 0.1 wt % or higher and preferably 0.5 wt % or higher. The concentration of a binding agent higher than these upper limits would result in the large internal resistance of the negative electrode, whereas the concentration of a binding agent lower than these lower limits would result in the binding property of the layer of the negative electrode active substance being poor.

B: The structure in which particles obtained by combining the negative electrode active substance with a conductive substance and a binding agent are applied on a current collector This structure is made by forming the active substance layer containing particles obtained by combining the negative electrode material particles of the present invention with a conductive substance and a binding agent, typically through the step of applying a slurry obtained by dispersing the composite particles and the binding agent in water or an organic solvent described in (1) above on a current collector substrate so as to be a thin layer and drying the thin layer, and the subsequent pressing step of pressing the dried layer until it has a predetermined thickness and a predetermined density.

<Conductive Substance>

As the conductive substance, a conductive oxide, carbon, graphite, carbon black or another conductive material is used. For example, the conductive oxide includes $In_2O_3$, ZnO and $SnO_2$, the conductive carbon includes CVD carbon, and the conductive graphite includes naturally-occurring graphite, artificial graphite and VGCF.

<Composite Particles>

The composite particles are obtained by mixing and combining the negative electrode active substance containing the negative electrode material particles of the present invention with a conductive substance through mechanochemical synthesis, CVD, sintering the substances to a carbon precursor or the like.

In the mixing and combining method based on mechanochemical synthesis, a ball mill, a vibrating mill, a planetary ball mill, Mechanofusion (manufactured by Hosokawa Micron, Ltd.), a hybridizer, Micros (manufactured by Nara Machinery Co., Ltd.) and other similar apparatuses may be used.

Examples of the CVD method include a method in which a hydrocarbon gas is used as a starting material and the combination is achieved by forming film-like pyrolytic carbon (graphite) and/or fiber-like pyrolytic carbon on the surface of the negative electrode material particles. In addition, a catalyst such as Ni may be attached on the surface of the negative electrode material particles prior to the CVD treatment.

Examples of the method for sintering the substances to a carbon precursor include a method in which the negative electrode active substance containing the negative electrode material particles, a conductive substance and a carbon precursor formed using petroleum pitch, coal tar pitch or a resin as a starting material are mixed together, and then the materials are combined with each other through sintering at a temperature ranging from 600 to approximately 1300° C.

Examples of the structure of the composite particles include one in which fine particles of the negative electrode material particles are embedded in the matrix of the conductive substance, one in which the surface of each negative electrode material particle is coated with the conductive substance, and one in which fiber of the conductive substance is formed on the surface of each negative electrode material particle.

When the content ratio of the conductive substance in the composite particles is excessively large, the amount of the negative electrode active substance is small, so that also the discharge capacity may be small. On the other hand, when the content ratio is excessively small, the effect of improving conductivity brought about by the addition of the conductive substance may be unlikely to be exerted. Therefore, the content ratio of the negative electrode material particles of the present invention in the composite particles is typically 50 wt % or higher and particularly preferably 70 wt % or higher, as well as is typically 99 wt % or lower and particularly preferably 97 wt % or lower.

<Fiber-Like Pyrolytic Carbon>

As the fiber-like pyrolytic carbon, vapor-grown carbon fiber (VGCF), carbon nanofiber (CNF), carbon nanotube (CNT) or the like may be used. The CNF may be herringbone-like, platelet-like or tubular in shape or take other shapes, whereas the CNT may be in the form of a single-walled nanotube (SWNT), a multi-walled nanotube (MWNT) or the like.

The BET specific surface area of the fiber-like pyrolytic carbon is typically 300 $m^2/g$ or smaller, preferably 200 $m^2/g$ or smaller, and more preferably 100 $m^2/g$ or smaller, but is not particularly limited to these ranges. In the case where the BET specific surface area is larger than these upper limits, the fiber-like pyrolytic carbon reacts with the electrolyte solution when used as a negative electrode, and this reaction causes the charge/discharge efficiency at an initial stage to be reduced. In this case, it may be difficult to obtain a favorable battery. Also, the BET specific surface area of the fiber-like pyrolytic carbon is typically approximately 10 $m^2/g$ or larger. To measure the BET specific surface area, the method describe earlier can be used.

The interplanar spacing d002 of the fiber-like pyrolytic carbon crystallite existing in the form of VCGF or CNF is typically 0.350 nm or smaller, preferably 0.342 nm or smaller, and more preferably 0.338 nm or smaller, but is not particularly limited to these ranges. In the case where d002 is higher than these upper limits, the fiber-like pyrolytic carbon reacts with the electrolyte solution when used as a negative electrode, and this reaction causes the charge/discharge efficiency at an initial stage to be reduced. In this case, it may be difficult to obtain a favorable battery. In addition, d002 of the fiber-like pyrolytic carbon is limited to the range of 0.3345 nm or higher by the measurement principle. To measure the X-ray diffraction of this crystalline for the calculation of the interplanar spacing d002, the method described earlier can be used.

C: The structure in which the negative electrode active substance is sintered together with a current collector in the presence of a sintering agent This structure is made by forming the active substance layer that contains the negative electrode active substance containing the negative electrode material particles of the present invention and a sintering agent on a current collector, typically through the step of applying (or molding) the dispersed material obtained by mixing a sintering substance with the negative electrode active substance on a current collector substrate so as to be a thin layer and drying the thin layer, the next step of pressing the dried thin layer until it has a predetermined thickness and a predetermined density, and the subsequent heat treatment step of sintering the product.

<Sintering Agent>

As the sintering agent, a precursor of oxide, carbide, nitride or the like or a carbon precursor is used. Examples of the oxide precursor include organic zirconium compounds and organic titanium compounds, and examples of the carbon precursor include a product obtained by modifying the softening point and the volatile content of heat-treated (oxidized) petroleum pitch or coal tar pitch (TGP3500, manufactured by Osaka Kasei, Co., Ltd.).

When an excessive amount of the sintering agent is used, the amount of the negative electrode active substance is small, so that also the discharge capacity may be small. On the other hand, when a short amount of the sintering agent is used, the binding strength between the particles of the negative electrode active substance and between the current collector and the negative electrode active substance is reduced and the structure is lacking in the integrity necessary to be a negative electrode. In this case, removal of the negative electrode active substance or other problems may occur. Therefore, the content ratio of the sintering agent in the negative electrode active substance containing the negative electrode material particles of the present invention is typically 3 wt % or higher and preferably 5 wt % or higher, as well as is typically 50 wt % or lower and preferably 30 wt % or lower.

D: The structure in which the negative electrode active substance is combined with a current collector through bonds to a low-melting-point metal This structure is made by forming the active substance layer obtained by combining the negative electrode active substance containing the negative electrode material particles of the present invention with a low-melting-point metal on a current collector, typically through the step of applying (or molding) the dispersed material obtained by mixing the active electrode active substance with a low-melting-point metal on a current collector substrate so as to be a thin layer and drying the thin layer, the next step of pressing the dried thin layer until it has a predetermined thickness and a predetermined density, and the subsequent heat treatment step.

<Low-Melting-Point Metal>

As the low-melting-point metal, solder, wax or another similar material is used. Examples of the solder include an Sn—Pb alloy, low-melting-point solder containing Bi—In, and solder containing Ag, Sb or Cu. When an excessive amount of the low-melting-point metal is used, the amount of the negative electrode active substance is small, so that also the discharge capacity may be small. On the other hand, when a short amount of the low-melting-point metal is used, the binding strength between the particles of the negative electrode active substance and between the current collector and the negative electrode active substance is reduced and the structure is lacking in the integrity necessary to be a negative electrode. In this case, removal of the negative electrode active substance or other problems may occur. Therefore, the content ratio of the low-melting-point metal in the negative electrode active substance containing the negative electrode material particles of the present invention is typically 5 wt % or higher and preferably 10 wt % or higher, as well as is typically 60 wt % or lower and preferably 40 wt % or lower.

E: The structure in which the negative electrode active substance is combined with a current collector without using any binding component This structure is made by forming the active substance layer of the negative electrode active substance containing the negative electrode material particles of the present invention on a current collector without using any binding component, typically by a method in which the combination of the negative electrode active substance with the current collector is carried out, without using any binding component, by means of room-temperature impact consolidation, in which the active substance is allowed to collide against the current collector substrate at high speed in vacuum or other means. A more specific example of this method includes a method in which the film of the negative electrode active substance containing the negative electrode material particles of the present invention is formed directly on a current collector by aerosol deposition.

[3] Nonaqueous Electrolyte Rechargeable Battery

The nonaqueous electrolyte rechargeable battery according to the present invention is a nonaqueous electrolyte rechargeable battery having positive and negative electrodes capable of occluding/releasing lithium ions and an electrolyte, wherein the negative electrode according to the present invention is used as the negative electrode thereof. Any members other than the negative electrode that are required for constituting a battery, such as the positive electrode and the electrolyte constituting the nonaqueous electrolyte rechargeable battery according to the present invention, may be used without any particular limitation. Examples of the members other than the negative electrode constituting the nonaqueous electrolyte rechargeable battery according to the present invention are described below, but these examples do not limit the choice of materials that can be used.

[Positive Electrode]

The positive electrode is made by forming the active substance layer containing the positive electrode active substance and an organic substance having binding and thickening effects (a binding agent) on a current collector substrate, typically through the step of applying a slurry obtained by dispersing the positive electrode active substance and a binding agent in water or an organic solvent on a current collector substrate so as to be a thin layer and drying the thin layer, and the subsequent pressing step of pressing the dried thin layer until it has a predetermined thickness and a predetermined density.

<Positive Electrode Active Substance>

Any positive electrode active substance may be used without any particular limitation as long as the active substance is capable of occluding/releasing lithium ions, and examples thereof include a composite oxide material containing lithium and a transition metal, such as lithium cobalt oxide, lithium nickel oxide and lithium manganese oxide; a transition metal oxide material such as manganese dioxide; and a carbonaceous material such as graphite fluoride. More specifically, $LiFeO_2$, $LiCoO_2$, $LiNiO_2$, $LiMn_2O_4$ and nonstoichiometric compounds thereof, as well as $MnO_2$, $TiS_2$, $FeS_2$, $Nb_3S_4$, $Mo_3S_4$, $CoS_2$, $V_2O_5$, $P_2O_5$, $CrO_3$, $V_3O_3$, $TeO_2$, $GeO_2$ or another similar compound may be used. These compounds may be used separately or in combination of two or more kinds.

<Conductive Agent>

The layer of the positive electrode active substance may contain a conductive agent for a positive electrode. Any kind of electron-conducting material may be used as the conductive agent for a positive electrode as long as the material is not involved in chemical reactions at the charge/discharge potential of the positive electrode active substance to be used. For example, graphite such as naturally-occurring graphite (e.g., graphite scales) and artificial graphite, several types of carbon black such as acetylene black, Ketjen black, channel black, furnace black, lamp black and thermal black, several kinds of conductive fiber such as carbon fiber and metal fiber, metal particles of carbon fluoride, aluminum or the like, conductive whiskers of zinc oxide, potassium titanate or the like, conductive metal oxides such as titanium oxide or conductive organic materials such as polyphenylene derivatives may be contained separately or in combination with each other. Among these conductive agents, artificial graphite and acetylene black are particularly preferable. These agents may be used separately or in combination of two or more kinds.

The amount of the conductive agent added into the positive electrode active substance is preferably in the range of 1 to 50 wt %, and more preferably in the range of 1 to 30 wt %, but is not particularly limited to these ranges. When carbon or graphite is used, the amount is particularly preferable in the range of 2 to 15 wt %.

<Binding Agent>

Both thermoplastic resin and thermosetting resin may be used without any particular limitation as the binding agent constituting the layer of the positive electrode active substance. Examples of the binding agent include polyethylene, polypropylene, polytetrafluoroethylene (PTFE), polyvinylidene fluoride (PVDF), styrene-butadiene rubber, tetrafluoroethylene-hexafluoroethylene copolymer, tetrafluoroethylene-hexafluoropropylene copolymer (FEP), tetrafluoroethylene-perfluoroalkylvinylether copolymer (PFA), vinylidene fluoride-hexafluoropropylene copolymer, vinylidene fluoride-chlorotrifluoroethylene copolymer, ethylene-tetrafluoroethylene copolymer (ETFE resin), polychlorotrifluoroethylene (PCTFE), vinylidene fluoride-pentafluoropropylene copolymer, propylene-tetrafluoroethylene copolymer, ethylene-chlorotrifluoroethylene copolymer (ECTFE), vinylidene fluoride-hexafluoropropylene-tetrafluoroethylene copolymer, vinylidene fluoride-perfluoromethylvinylether-tetrafluoroethylene copolymer, ethylene-acrylic acid copolymer and the $Na^+$-cross-linked product thereof, ethylene-methacrylic acid copolymer and the $Na^+$-cross-linked product thereof, and ethylene-methyl methacrylate copolymer and the $Na^+$-cross-linked product thereof, and these materials may be used separately or in the form of the mixture thereof. Among the materials described above, polyvinylidene fluoride (PVDF) and polytetrafluoroethylene (PTFE) are particularly preferable.

<Other Additives>

The layer of the positive electrode active substance may further contain a filler, a dispersing agent, an ion conductor, a pressure-enhancing agent and other kinds of additives in addition to the abovementioned conductive agent. As the filler, any fiber-like material that is not involved in chemical reactions in a configured battery may be used. In general, olefin polymer such as polypropylene and polyethylene or glass fiber or carbon fiber is used. The content ratio of the filler in the active substance layer is preferably in the range of 0 to 30 wt %, but is not particularly limited to this range.

<Solvent>

An aqueous solvent or an organic solvent is used as a dispersion medium in the preparation of the slurry of the positive electrode active substance. Although water is typically used as the aqueous solvent, an additive such as ethanol or other alcohols and N-methylpyrrolidone or other cyclic amides may be added into water as long as the concentration of the additive is not more than approximately 30 wt %.

Typical examples of the organic solvent include cyclic amides such as N-methylpyrrolidone, linear amides such as N,N-dimethylformamide and N,N-dimethylacetamide, aromatic hydrocarbons such as anisole, toluene and xylene, and alcohols such as butanol and cyclohexanol. Among these solvents, cyclic amides such as N-methylpyrrolidone and linear amides such as N,N-dimethylformamide and N,N-dimethylacetamide are preferable.

The layer of the positive electrode active substance is formed through the step of preparing the slurry of the positive electrode active substance by mixing the positive electrode active substance, an organic substance that has binding and thickening effects and acts as a binding agent, a conductive agent for a positive electrode, which is used as needed, and a filler or other additives, and the subsequent step of applying this slurry on a current collector substrate for a positive electrode so as to have a predetermined thickness.

The upper limit of the concentration of the positive electrode active substance in the slurry of the positive electrode active substance is typically 70 wt % or lower and preferably 55 wt % or lower, whereas the lower limit thereof is typically 30 wt % or higher and preferably 40 wt % or higher. In the slurry of the positive electrode active substance containing the positive electrode active substance at a concentration higher than these upper limits, the positive electrode active substance contained in the slurry of the positive electrode active substance is likely to aggregate. On the other hand, the concentration lower than the lower limits described above would result in the positive electrode active substance being likely to precipitate during the storage of the slurry of the positive electrode active substance.

The upper limit of the concentration of a binding agent in the slurry of the positive electrode active substance is typically 30 wt % or lower and preferably 10 wt % or lower, whereas the lower limit thereof is typically 0.1 wt % or higher and preferably 0.5 wt % or higher. The concentration of a binding agent higher than these upper limits would result in the large internal resistance of the positive electrode, whereas the concentration of a binding agent lower than these lower limits would result in the binding property of the layer of the positive electrode active substance being poor.

<Current Collector>

Preferably, the current collector for a positive electrode is, for example, a valve metal that is coated with a passive film in an electrolyte solution because of oxidation of the positive electrode or an alloy thereof. Examples of such a valve metal include metals belonging to Groups IV, V and XIII in the periodic table and alloys thereof. More specific examples thereof include Al, Ti, Zr, Hf, Nb and Ta and alloys containing these metals, with Al, Ti and Ta and alloys containing these metals being preferable. Al and an alloy thereof are particularly preferable because they are light and thus exhibit a high energy density. The thickness of the current collector for a positive electrode is typically in the range of 1 to 50 μm, but is not particularly limited to this range.

<Electrolyte>

Any types of electrolytes including an electrolyte solution and a solid electrolyte may be used as the electrolyte. Here the electrolyte means any kinds of ion conductors, and includes an electrolyte solution and a solid electrolyte.

As the electrolyte, for example, a solution obtained by dissolving a solute in a nonaqueous solvent may be used. The solute may include an alkali metal salt, a quaternary ammonium salt and other similar salts. More specifically, $LiClO_4$, $LiPF_6$, $LiBF_4$, $LiCF_3SO_3$, $LiN(CF_3SO_2)_2$, $LiN(CF_3CF_2SO_2)_2$, $LiN(CF_3SO_2)(C_4F_9SO_2)$, $LiC(CF_3SO_2)_3$ or the like is preferably used. These solutes may be used separately or in combination of two or more kinds.

The concentration of such a solute in the electrolyte solution is preferably 0.2 mol/L or higher and particularly preferably 0.5 mol/L or higher, as well as is preferably 2 mol/L or lower and particularly preferably 1.5 mol/L or lower.

Examples of the nonaqueous solvent include cyclic carbonates such as ethylene carbonate, propylene carbonate, butylene carbonate and vinylene carbonate, cyclic ester compounds such as γ-butyrolactone; linear ethers such as 1,2-dimethoxyethane; cyclic ethers such as crown ethers, 2-methyltetrahydrofuran, 1,2-dimethyltetrahydrofuran, 1,3-dioxolan and tetrahydrofuran; and linear carbonates such as diethylcarbonate, ethylmethylcarbonate and dimethylcarbonate In particular, a nonaqueous solvent that contains a cyclic carbonate and a linear carbonate is preferable. These solvents may be used separately or in combination of two or more kinds.

The nonaqueous electrolyte solution according to the present invention may contain a cyclic carbonate ester that has unsaturated bonds in its molecule and several kinds of known auxiliary agents such as an overcharge protection agent, a deoxidizing agent and a dehydrating agent.

Examples of the cyclic carbonate ester that has unsaturated bonds in its molecule include vinylene carbonate compounds, vinylethylene carbonate compounds and methylene ethylene carbonate compounds.

Examples of the vinylene carbonate compounds include vinylene carbonate, methylvinylene carbonate, ethylvinylene carbonate, 4,5-dimethylvinylene carbonate, 4,5-diethylvinylene carbonate, fluorovinylene carbonate and trifluoromethylvinylene carbonate.

Examples of the vinylethylene carbonate compounds include vinylethylene carbonate, 4-methyl-4-vinylethylene carbonate, 4-ethyl-4-vinylethylene carbonate, 4-n-propyl-4-vinylethylene carbonate, 5-methyl-4-vinylethylene carbonate, 4,4-divinylethylene carbonate and 4,5-divinylethylene carbonate.

Examples of the methylene ethylene carbonate compounds include methylene ethylene carbonate, 4,4-dimethyl-5-methylene ethylene carbonate and 4,4-diethyl-5-methylene ethylene carbonate.

Among these compounds, vinylene carbonate and vinylethylene carbonate are preferable and vinylene carbonate is particularly preferable.

These compounds may be used separately or in combination of two or more kinds.

When such a cyclic carbonate ester that has unsaturated bonds in its molecule is contained in the nonaqueous electrolyte solution, the content ratio thereof in the nonaqueous electrolyte solution is typically 0.01 wt % or higher, preferably 0.1 wt % or higher, more preferably 0.3 wt % or higher and most preferably 0.5 wt % or higher, as well as is typically 8 wt % or lower, preferably 4 wt % or lower and more preferably 3 wt % or lower.

Adding such a cyclic carbonate ester that has unsaturated bonds in its molecule into the electrolyte solution can improve the charge/discharge cycle properties of the battery. Although the reason for this improvement is unknown, it seems that the formation of a stable protection film on the surface of the negative electrode contributes. It should be noted that the battery properties cannot be sufficiently improved when the content ratio of the cyclic carbonate ester is small. However, an excessive content ratio of the cyclic carbonate ester leads to increased gas generation when the battery is stored at high temperatures, and thus the content ratio thereof in the electrolyte solution is preferably in the abovementioned range.

Examples of the overcharge protection agent include aromatic compounds such as biphenyl, alkyl biphenyl, terphenyl, partially hydrogenated terphenyl, cyclohexylbenzene, t-butylbenzene, t-amylbenzene, diphenylether and dibenzofuran; partially fluorinated products of the abovementioned aromatic compounds such as 2-fluorobiphenyl, o-cyclohexylfluorobenzene, and p-cyclohexylfluorobenzene; and fluorine-containing anisole compounds such as 2,4-difluoroanisole, 2,5-difluoroanisole and 2,6-difluoroanisole. These compounds may be used separately or in combination of two or more kinds.

The content ratio of such an overcharge protection agent in the nonaqueous electrolyte solution is typically in the range of 0.1 to 5 wt %. The addition of such an overcharge protection agent can suppress explosions or ignition of the battery in such cases as overcharge of the battery.

Examples of the other kinds of auxiliary agents include carbonate compounds such as fluoroethylene carbonate, trifluoropropylene carbonate, phenylethylene carbonate, erythritan carbonate, spiro-bis-dimethylene carbonate, and methoxyethyl-methyl carbonate; anhydrous carboxylic acid compounds such as anhydrous succinic acid, anhydrous glutaric acid, anhydrous maleic acid, anhydrous citraconic acid, anhydrous glutaconic acid, anhydrous itaconic acid, anhydrous diglycolic acid, cyclohexane dicarboxylic acid anhydride, cyclopentane tatracarboxylic acid dianhydride and phenylsuccinic acid anhydride; sulfur-containing compounds such as ethylene sulfite, 1,3-propane sultone, 1,4-butane sultone, methyl methanesulfonate, busulfan, sulfolane, sulfolene, dimethylsulfone and tetramethylthiuram monosulfide, N,N-dimethylmethanesulfonamide and N,N-diethylmethanesulfonamide; nitrogen-containing compounds such as 1-methyl-2-pyrrolidinone, 1-methyl-2-piperidone, 3-methyl-2-oxazolidinone, 1,3-dimethyl-2-imidazolidinone and N-methylsuccinimide; hydrocarbon compounds such as heptane, octane and cycloheptane, and fluorine-containing aromatic compounds such as fluorobenzene, difluorobenzene, hexafluorobenzene and benzotrifluoride. These compounds may be used separately or in combination of two or more kinds.

The content ratio of such auxiliary agents in the nonaqueous electrolyte solution is typically in the range of 0.1 to 5 wt %. The addition of such auxiliary agents can improve the capacity-maintaining performance during storage at high temperatures and the charge/discharge cycle properties.

The nonaqueous electrolyte solution may be in the form of a gel-like, rubber-like or solid-sheet-like solid electrolyte formed by adding an organic polymer compound into an electrolyte solution. Specific examples of the organic polymer compounds used in this case include polyether polymer compounds such as polyethylene oxide and polypropylene oxide; cross-linked polymer compounds of the polyether polymer compounds; vinyl alcohol polymer compounds such as polyvinyl alcohol and polyvinyl butyral; insolubilized products of the vinyl alcohol polymer compounds; polyepichlorohydrin; polyphosphazene; polysiloxane; vinyl polymer compounds such as polyvinylpyrrolidone, polyvinylidene carbonate and polyacrylonitrile; and copolymer compounds such as poly($\Omega$-methoxyoligooxyethylene methacrylate), poly($\Omega$-methoxyoligooxyethylene methacrylate-co-methyl methacrylate).

[Other Components]

Besides the electrolyte, negative electrode and positive electrode, the negative electrode for a nonaqueous electrolyte rechargeable battery may have an outer can, a separator, a gasket, a covering plate, a cell case and other components as needed.

There is no particular limitation on the material and shape of the separator. The separator is used to avoid physical contact between the positive electrode and the negative electrode, and preferably has high ion permeability and low electric resistance. The material of the separator is preferably selected from materials stable in the electrolyte solution and excellent in terms of liquid-holding property. Specific examples thereof include a porous sheet and a nonwoven fabric formed of polyolefin, such as polyethylene and polypropylene.

[Shape of the Nonaqueous Electrolyte Rechargeable Battery]

The shape of the nonaqueous electrolyte rechargeable battery according to the present invention is not particularly limited, and it may be, for example, a cylinder in which sheet electrodes and a separator form a spiral, a cylinder that takes the inside-out structure integrating pellet electrodes and a separator, or a coin in which pellet electrodes and a separator are stacked on each other.

[Production Method of the Nonaqueous Electrolyte Rechargeable Battery]

The method for producing the nonaqueous electrolyte rechargeable battery according to the present invention that has at least an electrolyte, a negative electrode and a positive electrode is not particularly limited, and can be selected from commonly used methods as necessary.

One example of the method for producing the nonaqueous electrolyte rechargeable battery according to the present invention is a method in which a negative electrode is mounted on an outer can, an electrolyte solution and a separator are stacked thereon, a positive electrode is placed thereon so as to face the negative electrode, and then the members are crimped together with a gasket and a covering plate so as to form into a battery.

EXAMPLES

The present invention is explained in more detail with reference to examples below. However, the present invention is not limited to these examples as long as it falls within the scope thereof.

Example 1

A film was formed using Si as the target material and an SUS plate having a thickness of 1 mm as the substrate with a direct-current sputtering apparatus ("HSM-52" manufactured by Shimadzu Corporation).

In this process, the substrate was attached to a water-cooled holder and the temperature thereof was maintained approximately 25° C. A high-purity nitrogen gas was introduced to the chamber, which had been depressurized to have an internal pressure of $4 \times 10^{-4}$ Pa, while the opening of the main valve was being adjusted so that the pressure reached 0.16 Pa. Subsequently, a high-purity argon gas was introduced to the chamber until the pressure reached 1.6 Pa, and then a film-forming step was carried out for 180 minutes at a power density of 7.1 W/cm$^2$. In addition, the content ratio of nitrogen in the sputtering gas was 10%.

The SUS substrate was detached and then the formed film was easily removed from the substrate as a thin section. One cycle of the abovementioned film-forming step provided such a thin section weighing approximately 0.7 g, and this cycle was repeated until thin sections totally weighing approximately 5 g were obtained. The obtained thin sections were ground in an agate mortar, and the resulting particles were classified by size using a sieve of 45-μm mesh size and designated as the negative electrode material particles.

The scanning electron microscope (SEM) image of the obtained negative electrode material particles is shown in FIG. 1a.

The volume average particle diameter of the negative electrode material particles was measured to be 11 μm using a particle size distribution analyzer ("LA-920" manufactured by HORIBA, Ltd.) according to the method described earlier.

The composition analysis of the negative electrode material particles was performed using XPS according to the method described later, and it was found that the content ratio of the element N in the particles was 32 atomic percent and the N concentration ratio Q(N) against the concentration of the element N in SiN was equivalent to 0.65. Expressed by the atomic concentration ratio, the composition was Si/N/O=1.00/0.48/0.03.

The Raman values of the negative electrode material particles were determined in Raman spectrometry according to the method described later, and it was found that RPSN was 0.44 and RPS was 0.49.

X-ray diffraction measurement of the negative electrode material particles was performed according to the method described later. Distinct peaks corresponding to $Si_3N_4$ or other species were not detected and XPsz was 0.91.

The distribution of the elements Si and N across the section of each negative electrode material particle was determined using an electron probe microanalyzer (EPMA) according to the method describe later. The obtained results are shown in FIGS. 1b and 1c. In FIG. 1c, it was confirmed that the element N measuring 500 nm or smaller was uniformly distributed in Si particles.

<XPS Measurement>

As X-ray photoelectron spectrometry, the depth profile measurement was carried out, in which the negative electrode particles were placed on the sample stage of an X-ray photoelectron spectrometer ("ESCA" manufactured by ULVAC-PHI, Inc.) so that the surfaces thereof formed a flat plane, and then the depth profile of the sample was determined while sputtering Ar, using aluminum Kα radiation as the X-ray source. At the depth of constant concentration (e.g., 150 nm), spectra of Si2p (90 to 110 eV), C1s (280 to 300 eV), N1s (390 to 405 eV) and O1s (525 to 545 eV) were obtained. Charges were corrected assuming that the top of the peak of C1s, which was detected as impurities or the like, was 284.5 eV so as to provide the peak areas of the Si2p, N1s and O1s spectra, and the resulting peak areas were multiplied by the factor of instrument sensitivity so as to provide the atomic percentage of Si, N and O. Based on the results, the atomic concentration ratio Si/N/O (atomic percentage of Si/atomic percentage of N/atomic percentage of O) of the negative electrode material particles was determined. The obtained atomic percentage of N was used also for calculating the N concentration ratio Q(N) as described earlier.

<Raman Spectrometry>

Using a Raman spectrometer ("Raman Spectrometer" manufactured by JASCO Corporation), the Raman measurement was carried out by putting the negative electrode material particles into a measurement cell, and then exposing the surface of the sample contained in the cell to an argon ion laser beam.

The conditions used in this Raman measurement were as follows.

Wavelength of argon ion laser: 514.5 nm
Laser power on the sample: 15 to 40 mW
Resolution: 10 to 20 $cm^{-1}$
Measurement range: 200 to 1900 $cm^{-1}$
Exposure time: 30 to 300 sec.
Number of integrations: 3
Smoothing process: Simple average of 15 points of convolution <X-ray Diffractometry>

Using an "RINT2000PC" manufactured by Rigaku Corporation, the X-ray diffraction measurement was carried out according to the out-of-plane method, with the negative electrode material particles being placed in a measurement cell, in the measurement range where 2θ was in the range of 10 to 90°. The background was corrected by drawing a line passing through an area where 2θ was in the range of 10 to 20° and another area where 2θ was in the range of 50 to 70°.

<EPMA Measurement>

Using an electron probe microanalyzer ("JXA-8100" manufactured by JEOL, Ltd.), elemental analysis was carried out for the resin-embedded negative electrode material particles on sections thereof formed with a microtome.

A lithium rechargeable battery containing the negative electrode material particles produced as described above was prepared by the method described later, and this battery was evaluated for the discharge capacity, charge/discharge efficiency, charge/discharge cycle properties (A) and electrode expansion in volume after charge/discharge cycles. The results are shown in Table 2.

<Production Method of the Lithium Rechargeable Battery>

Artificial graphite having an interplanar spacing $d_{002}$ of the crystal plane (002) of 0.336 nm and an average particle diameter of 6 μm was added as the negative electrode material A to 1.6 g of the negative electrode material particles produced as described above so that the weight ratio was 20/80 (=negative electrode material particles of the present invention/negative electrode material A), and the resulting mixture was subjected to dry blending using an agate mortar. To the obtained mixed particles, carboxymethyl cellulose (CMC) as a binding agent accounting for 1.5 wt % (provided that the content ratio of the mixed particles was 100 wt %) and styrene-butadiene rubber (SBR) accounting for 2 wt % were added in the form of an aqueous solution and an aqueous suspension, respectively, and then the mixture was further blended. The resulting mixture was applied on a copper film having a thickness of 18 μm and subjected to preliminary drying at 80° C. for 30 minutes. Disks having a diameter of 12.5 mm were punched out of the dried mixture, and dried at 110° C. in vacuum for one day and one night. The product was used as the test negative electrode.

<Production Method of the Lithium Rechargeable Battery>

The obtained negative electrode was placed in a glove box filled with an argon gas, and then a coin battery (a lithium rechargeable battery) was assembled of 1 mol/L $LiPF_6$ electrolyte solution using the mixed solvent of ethylene carbonate (EC)/diethyl carbonate (DEC)=3/7 (weight ratio) as the electrolyte solution, a polyethylene separator as the separator, and a lithium metal counter electrode as the counter electrode.

<Evaluation of Discharge Capacity>

The lithium counter electrode was charged until the voltage was 10 mV at a current density of 1.23 $mA/cm^2$, and further charged until the current was 0.123 mA at a constant voltage of 10 mV so as to dope the negative electrode with lithium ions. Subsequently, the lithium counter electrode was discharged until the voltage was 1.5 V at a current density of 1.23 $mA/cm^2$. This charge/discharge cycle was repeated five times, and the average discharge of charge/discharge cycles 3 to 5 was designated as the discharge capacity. In addition, when the discharge capacity per unit weight was necessary, this value was calculated according to the following formula after determining the active substance weight by subtracting the weight of a copper film that had been cut out so as to have the same area as the negative electrode had from the weight of the negative electrode:

Discharge capacity(mAh/g)=Average discharge capacity of charge/discharge cycles 3 to 5(mAh)/Active substance weight(g)

Active substance weight(g)=Negative electrode weight (g)−Weight of a copper film cut out so as to have the same area(g)

<Evaluation of Charge/Discharge Efficiency>

The charge/discharge efficiency was calculated according to the following formula at the time of the measurement of the discharge capacity.

Charge/Discharge efficiency(%)={Initial discharge capacity(mAh)/Initial charge capacity(mAh)}×100

<Evaluation of Charge/Discharge Cycle Properties (A)>

The charge/discharge cycle as per the measurement method of the discharge capacity above was repeated 20 times, and then the charge/discharge-cycle-maintaining ratio (A) was calculated following the formula below:

Charge/discharge-cycle-maintaining ratio(A)(%)={Discharge capacity after the completion of 20 charge/discharge cycles(mAh)/Average discharge capacity of charge/discharge cycles 3 to 5(mAh)}×100

<Evaluation of Charge/Discharge Efficiency at Charge/Discharge Cycle 20>

The charge/discharge cycle as per the measurement method of the charge/discharge cycle properties (A) above was repeated 20 times, and then the charge/discharge efficiency at charge/discharge cycle 20 was calculated.

Charge/Discharge efficiency at charge/discharge cycle 20(%)={Discharge capacity at charge/discharge cycle 20 (mAh)/Charge capacity at charge/discharge cycle 20(mAh)}×100

<Measurement of the Ratio of Electrode Expansion in Volume after Charge/Discharge Cycles>

After the measurement of the charge/discharge cycle properties (A) described above (after 20 charge/discharge cycles were completed), the coin battery in a discharged state was disassembled in an argon-filled glove box while avoiding short-circuit. After the removed electrode was washed with an anhydrous dimethyl ether solution and dried, the thickness of the electrode (excluding the copper film) in a discharged state after charge/discharge cycles was measured by SEM observation. Based on the original thickness of the electrode (excluding the copper film) before being assembled into the battery, the ratio of electrode expansion in volume after charge/discharge cycles was calculated according to the following formula:

Ratio of electrode expansion in volume after charge/discharge cycles(times)=(Electrode thickness after the completion of charge/discharge cycles/Electrode thickness before being charged/discharged)

Example 2

A film was formed by electron-beam-heating vapor deposition with the vapor deposition source being pellets of the mixture containing Si particles of approximately 20 μm and graphite so that the weight ratio thereof was 8:2, the substrate being an SUS plate having a thickness of 1 mm, and the equipment being "EX-400" manufactured by ULVAC Technologies, Inc. In this process, the film-forming step was carried out in a chamber which had been depressurized to have an internal pressure of $9 \times 10^{-5}$ Pa for 120 minutes with the emission current being 60 mA.

The SUS substrate was detached and then the formed film was easily removed from the substrate as a thin section. One cycle of the abovementioned film-forming step provided such a thin section weighing approximately 0.5 g, and this cycle was repeated until thin sections totally weighing approximately 3 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 12 μm using a particle size distribution analyzer in the same way as Example 1.

The composition analysis of the negative electrode material particles was performed, and it was found that the content ratio of the element C in the particles was 19 atomic percent and the C concentration ratio Q(C) against the concentration of the element C in SiC was equivalent to 0.46. Expressed by the atomic concentration ratio, the composition was Si/C/o=1.00/0.30/0.27.

The Raman values of the negative electrode material particles were determined in the same way as Example 1, and it was found that RPC was 0.10, RPSC was 0.15 and RPS was 0.55.

X-ray diffraction measurement of the negative electrode material particles was performed according to the method described later. A distinct peak corresponding to SiC was not detected and XPsz was 0.38.

The distribution of the element C was determined using an EPMA in the same way as Example 1, and it was confirmed that the element C measuring 500 nm or smaller was uniformly distributed in Si particles in a similar fashion to Example 1.

In the same way as Example 1, the negative electrode and the coin battery were produced from these negative electrode material particles and then the coin battery was evaluated. The results are shown in Table 2.

<X-ray Diffractometry>

The X-ray diffraction measurement was carried out in the same way as Example 1, except that the measurement range was one where 2θ was in the range of 10 to 70°. The background was corrected by drawing a line passing through an area where 2θ was in the range of 15 to 20° and another area where 2θ was in the range of 40 to 45°.

Example 3

A film was formed using the mixture of Si and C (a disk containing Si and C with the area ratio thereof being approximately 100:9) as the target material and a glossy SUS plate having a thickness of 1 mm as the substrate with a direct-current sputtering apparatus ("HSM-52" manufactured by Shimadzu Corporation). In this process, the SUS substrate was attached to a water-cooled holder and the temperature thereof was maintained approximately 25° C. A high-purity argon gas was introduced at a flow rate of 40 sccm to the chamber, which had been depressurized to have an internal pressure of $4 \times 10^{-4}$ Pa, while the opening of the main valve was being adjusted so that the pressure reached 1.6 Pa. Subsequently, a film-forming step was carried out for 180 minutes at a power density of 7 W/cm². In addition, the content ratio of oxygen in the sputtering gas was 0.001%.

The SUS substrate was detached and then the formed film was easily removed from the substrate as a thin section. One cycle of the abovementioned film-forming step provided such a thin section weighing approximately 0.7 g, and this cycle was repeated until thin sections totally weighing approximately 8 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 15 μm using a particle size distribution analyzer in the same way as Example 1. Also, the BET specific surface area was measured to be 7 m²/g.

The composition analysis of the negative electrode material particles was performed in the same way as Example 1, and it was found that the content ratio of the element C in the particles was 25 atomic percent and the C concentration ratio Q(C) against the concentration of the element C in SiC was equivalent to 0.52. Expressed by the atomic concentration ratio, the composition was Si/C/O=1.00/0.35/0.04.

The Raman values of the negative electrode material particles were determined in the same way as Example 1, and it was found that RPC was 0.05 and RPS was 0.45. As for RPSC, the peak so was not detected. Also, X-ray diffraction measurement of the negative electrode material particles was performed in the same way as Example 1. A distinct peak corresponding to SiC was not detected and XPsz was 0.38.

The distribution of the element C was determined using an EPMA in the same way as Example 1, and it was confirmed that the element C measuring 500 nm or smaller was uniformly distributed in Si particles in a similar fashion to Example 1.

In the same way as Example 1, the negative electrode and the coin battery were produced from these negative electrode material particles and then the coin battery was evaluated. The results are shown in Table 2.

Example 4

The negative electrode and the coin battery were produced and then the coin battery was evaluated in the same way as Example 1, except that artificial graphite having an interplanar spacing $d_{002}$ of the crystal plane (002) of 0.336 nm and an average particle diameter of 6 μm was added as the negative electrode material A to 1.6 g of the negative electrode material particles produced in Example 1, with the weight ratio being 60/40 (=negative electrode material particles of the present invention/negative electrode material A). The results are shown in Table 2.

Example 5

A film-forming step was carried out for 180 minutes in the same way as Example 1, except that the pressure of the high-purity nitrogen gas introduced to the chamber was changed to 0.24 Pa. In addition, the content ratio of nitrogen in the sputtering gas was 15%.

The SUS substrate was detached and then the formed film was easily removed from the substrate as a thin section. One cycle of the abovementioned film-forming step provided such a thin section weighing approximately 0.6 g, and this cycle was repeated until thin sections totally weighing approximately 3 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 10 μm using a particle size distribution analyzer in the same way as Example 1.

The composition analysis of the negative electrode material particles was performed in the same way as Example 1, and it was found that the content ratio of the element N in the particles was 41 atomic percent and the N concentration ratio Q(N) against the concentration of the element N in SiN equivalent to 0.82. Expressed by the atomic concentration ratio, the composition was Si/N/O=1.00/0.70/0.05.

The Raman values of the negative electrode material particles were determined in the same way as Example 1, and it was found that RPSN was 0.69 and RPS was 0.40. Also, X-ray diffraction measurement of the negative electrode material particles was performed in the same way as Example 1. Distinct peaks corresponding to $Si_3N_4$ or other species was not detected and XPsz was 0.94.

The distribution of the element N was determined using an EPMA in the same way as Example 1, and it was confirmed that the element N measuring 500 nm or smaller was uniformly distributed in Si particles in a similar fashion to Example 1.

In the same way as Example 1, the negative electrode and the coin battery were produced from these negative electrode material particles and then the coin battery was evaluated. The results are shown in Table 2.

Example 6

A film was formed using the mixture of Si and C (a disk containing Si and C with the area ratio thereof being approximately 100:9) as the target material and a glossy SUS plate having a thickness of 1 mm as the substrate with an RF sputtering apparatus ("CFS-4ES" manufactured by Tokuda Seisakusho Co., Ltd.). In this process, the SUS substrate was attached to a water-cooled holder and the temperature thereof was maintained approximately 25° C. A high-purity oxygen gas was introduced to the chamber, which had been depressurized to have an internal pressure of $2 \times 10^{-3}$ Pa, so that the pressure reached 0.02 Pa. Subsequently, a high-purity argon gas was introduced to the chamber until the pressure reached 0.67 Pa, and then a film-forming step was carried out for 180 minutes at a power density of 8.8 W/cm². In addition, the content ratio of oxygen in the sputtering gas was 3%.

The SUS substrate was detached and then the formed film was easily removed from the substrate as a thin section. One cycle of the abovementioned film-forming step provided such a thin section weighing approximately 0.7 g, and this cycle was repeated until thin sections totally weighing approximately 3 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 9 μm using a particle size distribution analyzer in the same way as Example 1.

The composition analysis of the negative electrode material particles was performed in the same way as Example 1, and it was found that the content ratio of the element C in the particles was 18 atomic percent and the C concentration ratio Q(C) against the concentration of the element C in SiC was equivalent to 0.48. Expressed by the atomic concentration ratio, the composition was Si/C/o=1.00/0.32/0.42.

The Raman values of the negative electrode material particles were determined in the same way as Example 1, and it was found that RPC was 0.12, RPSC was 0.18 and RPS was 0.68. Also, X-ray diffraction measurement of the negative electrode material particles was performed in the same way as Example 1. A distinct peak corresponding to SiC was not detected and XPsz was 0.70.

The distribution of the element C was determined using an EPMA in the same way as Example 1, and it was confirmed that the element C measuring 500 nm or smaller was uniformly distributed in Si particles in a similar fashion to Example 1.

In the same way as Example 1, the negative electrode and the coin battery were produced from these negative electrode material particles and then the coin battery was evaluated. The results are shown in Table 2.

Example 7

A film-forming step was carried out for 180 minutes in the same way as Example 3, except that the target material was the different mixture of Si and C (a disk containing Si and C with the area ratio thereof being approximately 100:2).

The SUS substrate was detached and then the formed film was easily removed from the substrate as a thin section. One cycle of the abovementioned film-forming step provided such a thin section weighing approximately 0.7 g, and this cycle was repeated until thin sections totally weighing approximately 3 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 12 μm using a particle size distribution analyzer in the same way as Example 1.

The composition analysis of the negative electrode material particles was performed in the same way as Example 1, and it was found that the content ratio of the element C in the particles was 15 atomic percent and the C concentration ratio Q(C) against the concentration of the element C in SiC was equivalent to 0.31. Expressed by the atomic concentration ratio, the composition was Si/C/O=1.00/0.18/0.07.

The Raman values of the negative electrode material particles were determined in the same way as Example 1, and it was found that RPC was 0.05 and RPS was 0.49. As for RPSC, the peak sc was not detected. Also, X-ray diffraction measurement of the negative electrode material particles was performed in the same way as Example 1. A distinct peak corresponding to SiC was not detected and XPsz was 0.15. The distribution of the element C was determined using an EPMA in the same way as Example 1, and it was confirmed that the element C measuring 500 nm or smaller was uniformly distributed in Si particles in a similar fashion to Example 1.

In the same way as Example 1, the negative electrode and the coin battery were produced from these negative electrode material particles and then the coin battery was evaluated. The results are shown in Table 2.

Example 8

A film-forming step was carried out for 180 minutes in the same way as Example 6, except that the target material was the different mixture of Si and C (a disk containing Si and C with the area ratio thereof being approximately 100:17), the pressure of the high-purity oxygen gas and the high-purity argon gas introduced to the chamber was changed to 0.015 Pa and 67 Pa, respectively. In addition, the content ratio of oxygen in the sputtering gas was 2%.

The SUS substrate was detached and then the formed film was easily removed from the substrate as a thin section. One cycle of the abovementioned film-forming step provided such a thin section weighing approximately 0.6 g, and this cycle was repeated until thin sections totally weighing approximately 3 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 11 μm using a particle size distribution analyzer in the same way as Example 1.

The composition analysis of the negative electrode material particles was performed in the same way as Example 1, and it was found that the content ratio of the element C in the particles was 55 atomic percent and the C concentration ratio Q(C) against the concentration of the element C in SiC was equivalent to 0.75. Expressed by the atomic concentration ratio, the composition was Si/C/O=1.00/0.60/0.40.

The Raman values of the negative electrode material particles were determined in the same way as Example 1, and it was found that RPC was 0.26, RPSC was 0.26 and RPS was 0.74. Also, X-ray diffraction measurement of the negative electrode material particles was performed in the same way as Example 1. A distinct peak corresponding to SiC was not detected and XPsz was 0.80. The distribution of the element C was determined using an EPMA in the same way as Example 1, and it was confirmed that the element C measuring 500 nm or smaller was uniformly distributed in Si particles in a similar fashion to Example 1.

In the same way as Example 1, the negative electrode and the coin battery were produced from these negative electrode material particles and then the coin battery was evaluated. The results are shown in Table 2.

Example 9

To the negative electrode material particles obtained in the same way as Example 3, nickel was attached so that the content ratio thereof was approximately 1 wt % on the basis of the weight of nickel, using a saturated solution of nickel acetate tetrahydrate (manufactured by Wako Pure Chemical Industries, Ltd.) in methanol as a catalyst. The attachment was carried out by adding the abovementioned saturated solution to the negative electrode material particles and then letting the methanol evaporate while stirring the mixture. The resulting negative electrode material particles in an aggregated state were ground in an agate mortar, and the resulting particles were classified by size using a sieve of 45-μm mesh size and designated as the nickel-catalyst-attached negative electrode material particles.

This nickel-catalyst-attached negative electrode material particles were weighed out and then transferred into a quartz reaction tube set in a tubular electric furnace. After the air in the reaction tube was substituted with a hydrogen gas, the temperature of the reaction tube was increased to 550° C. and maintained for 30 minutes so that the nickel acetate catalyst was reduced to metal nickel. After the reduction was completed, the hydrogen gas was replaced by an ethylene gas and then CVD was carried out at 550° C. for 5 minutes so as to produce composite particles in which fiber-like pyrolytic carbon was formed on the surface of the negative electrode material particles. At the same time, it was found that the content ratio of the attached fiber-like pyrolytic carbon relative to the negative electrode material particles was 30 wt % from the difference in weight before and after the CVD step.

The BET specific surface area of the composite particles was measured, and this value was subtracted from the abovementioned BET specific surface area of the negative electrode material particles and the weight ratio of the fiber-like pyrolytic carbon in order to calculate the BET specific surface area of the fiber-like pyrolytic carbon. The obtained value was 230 $m^2/g$. The crystal of the fiber-like pyrolytic carbon in a ground state was observed using a TEM and it was found that the crystal was in a herringbone-like structure.

Under the same conditions as those of the abovementioned CVD step, fiber-like pyrolytic carbon was formed directly on the nickel catalyst and collected. The X-ray diffraction measurement of the collected crystallite revealed that the interplanar spacing d002 was 0.343 nm.

<Production Method of the Negative Electrode Material for a Lithium Rechargeable Battery>

To the composite particles prepared in the method describe above, carboxymethyl cellulose (CMC) as a binding agent accounting for 1.5 wt % (provided that the content ratio of the composite particles was 100 wt %) and styrene-butadiene rubber (SBR) accounting for 2 wt % were added in the form of an aqueous solution and an aqueous suspension, respectively, and then the mixture was blended. The resulting mixture was applied on a copper film having a thickness of 18 μm and subjected to preliminary drying at 80° C. for 30 minutes. Disks having a diameter of 12.5 mm were punched out of the dried mixture, and dried at 110° C. in vacuum for one day and one night. The product was used as the test negative electrode.

In the same way as Example 1, the coin battery was produced from this negative electrode and then evaluated. The results are shown in Table 2.

Example 10

To the negative electrode material particles obtained in the same way as Example 3, iron was attached so that the content ratio thereof was approximately 1 wt % on the basis of the weight of iron, using an ethanol solution of iron nitrate nonahydrate (manufactured by Wako Pure Chemical Industries, Ltd.) as a catalyst. The attachment was carried out by adding the abovementioned solution to the negative electrode material particles and then letting the ethanol evaporate while stirring the mixture. The resulting negative electrode material particles in an aggregated state were ground in an agate mortar, and the resulting particles were classified by size using a sieve of 45-μm mesh size and designated as the iron-catalyst-attached negative electrode material particles.

This iron-catalyst-attached negative electrode material particles were weighed out and then transferred into a quartz reaction tube set in a tubular electric furnace. After the air in the reaction tube was substituted with a hydrogen gas, the temperature of the reaction tube was increased to 680° C. and maintained for 30 minutes so that the iron nitrate catalyst was reduced to metal iron. After the reduction was completed, the hydrogen gas was replaced by an ethylene gas and then CVD was carried out at 680° C. for 5 minutes so as to produce composite particles in which fiber-like pyrolytic carbon was formed on the surface of the negative electrode material particles. At the same time, it was found that the content ratio of the attached fiber-like pyrolytic carbon relative to the negative electrode material particles was 25 wt % from the difference in weight before and after the CVD step.

The BET specific surface area of the composite particles was measured, and this value was subtracted from the abovementioned BET specific surface area of the negative electrode material particles and the weight ratio of the fiber-like pyrolytic carbon in order to calculate the BET specific surface area of the fiber-like pyrolytic carbon. The obtained value was 80 m$^2$/g. The crystal of the fiber-like pyrolytic carbon in a ground state was observed using a TEM and it was found that the crystal was in a platelet-like structure.

Under the same conditions as those of the abovementioned CVD step, fiber-like pyrolytic carbon was formed directly on the iron catalyst and collected. The X-ray diffraction measurement of the collected crystallite revealed that the interplanar spacing d002 was 0.336 nm.

In the same way as Example 9, the negative electrode and the coin battery were produced from these composite particles and then the coin battery was evaluated. The results are shown in Table 2.

Comparative Example 1

Si particles were obtained by grinding commercially available Si granules and classifying the ground granules using a sieve of 45-μm mesh size. The volume average particle diameter of the Si particles was measured to be 10 μm using a particle size distribution analyzer in the same way as Example 1.

The composition analysis of the Si particles was performed in the same way as Example 1, and it was found that the elements C and N were not contained in the particles. Expressed by the atomic concentration ratio, the composition was Si/C/O=1.00/0.00/0.02. The Raman values of the Si particles were determined in the same way as Example 1, and it was found that RPS was 0.16 and RPSN was 0.09. As for RPC and RPSC, the peaks c and so, respectively, were not detected.

In the same way as Example 1, the negative electrode and the coin battery were produced from these Si particles and then the coin battery was evaluated. The results are shown in Table 2.

Comparative Example 2

Resistance-heating vapor deposition was performed with the vapor deposition source being SiO, the substrate being an SUS plate having a thickness of 1 mm, and the equipment being "VPC-260F" manufactured by ULVAC Technologies, Inc. In this process, the film-forming step was carried out in a chamber which had been depressurized to have an internal pressure of 3×10$^{-3}$ Pa for 120 minutes with the current being 155 A.

The SUS substrate was detached and then the formed film was easily removed from the substrate as a thin section. One cycle of the abovementioned film-forming step provided such a thin section weighing approximately 0.6 g, and this cycle was repeated until thin sections totally weighing approximately 3 g were obtained. The obtained thin sections were ground in an agate mortar, and the resulting particles were classified by size using a sieve of 45-μm mesh size and designated as the SiO particles.

The volume average particle diameter of the SiO particles was measured to be 8 μm using a particle size distribution analyzer in the same way as Example 1.

The composition analysis of the SiO particles was performed in the same way as Example 1, and it was found that the content ratio of the element O in the particles was 57 atomic percent and the O concentration ratio Q(O) against the concentration of the element O in SiO$_2$ was equivalent to 0.86. Expressed by the atomic concentration ratio, the composition was Si/C/O=1.00/0.00/1.33.

The Raman values of the SiO particles were determined in the same way as Example 1, and it was found that RPC was 0.17, RPSC was 0.06, RPS was 1.09 and RPSN was 0.10.

In the same way as Example 4, the negative electrode and the coin battery were produced from these SiO particles and then the coin battery was evaluated. The results are shown in Table 1.

Comparative Example 3

A film-forming step was carried out for 120 minutes in the same way as Example 3, except that the target material was the mixture of Si and Ni (a disk containing Si and Ni with the area ratio thereof being approximately 100:4).

The SUS substrate was detached and then the formed film was easily removed from the substrate as a thin section. One cycle of the abovementioned film-forming step provided such a thin section weighing approximately 0.8 g, and this cycle was repeated until thin sections totally weighing approximately 3 g were obtained. The obtained thin sections were ground in an agate mortar, and the resulting particles were classified by size using a sieve of 45-μm mesh size and designated as the test particles.

The volume average particle diameter of these particles was measured to be 14 μm using a particle size distribution analyzer in the same way as Example 1.

The composition analysis of these particles was performed in the same way as Example 1, and it was found that the content ratio of the element Ni in the particles was 26 atomic percent and the Ni concentration ratio Q(Ni) against the concentration of the element Ni in NiSi$_2$ was equivalent to 0.81=Expressed by the atomic concentration ratio, the composition was Si/Ni/O=1.00/0.37/0.06. The Raman values of the negative electrode material particles were determined in the same way as Example 1, and it was found that RPSC was 0.04, RPS was 0.28 and RPSN was 0.07. As for RPC, the peak c was not detected.

In the same way as Example 1, the negative electrode and the coin battery were produced from these negative electrode material particles and then the coin battery was evaluated. The results are shown in Table 2.

Comparative Example 4

A film-forming step was carried out for 120 minutes in the same way as Example 3, except that the target material was the mixture of Si and B (a disk containing Si and B with the area ratio thereof being approximately 100:8).

The SUS substrate was detached and then the formed film was easily removed from the substrate as a thin section. One cycle of the abovementioned film-forming step provided such a thin section weighing approximately 0.8 g, and this cycle was repeated until thin sections totally weighing approximately 3 g were obtained. The obtained thin sections were ground in an agate mortar, and the resulting particles were classified by size using a sieve of 45-μm mesh size and designated as the test particles.

The volume average particle diameter of these particles was measured to be 9 μm using a particle size distribution analyzer in the same way as Example 1.

The composition analysis of these particles was performed in the same way as Example 1, and it was found that the content ratio of the element B in the particles was 38 atomic percent and the B concentration ratio Q(B) against the concentration of the element B in $SiB_3$ was equivalent to 0.75. Expressed by the atomic concentration ratio, the composition was Si/B/O=1.00/0.59/0.03. The Raman values were determined in the same way as Example 1, and it was found that RPSC was 0.02, RPS was 0.28 and RPSN was 0.07. As for RPC, the peak c was not detected.

In the same way as Example 1, the negative electrode and the coin battery were produced from these particles and then the coin battery was evaluated. The results are shown in Table 2.

Comparative Example 5

A film-forming step was carried out in the same way as Example 3, except that the target material was the sintered mixture of Si, SiO and C particles.

The SUS substrate was detached and then the formed film was easily removed from the substrate as a thin section.

One cycle of the abovementioned film-forming step provided such a thin section weighing approximately 0.5 g, and this cycle was repeated until thin sections totally weighing approximately 2.5 g were obtained. The obtained thin sections were ground in an agate mortar, and the resulting particles were classified by size using a sieve of 45-μm mesh size and designated as the test particles.

The volume average particle diameter of these particles was measured to be 12 μm using a particle size distribution analyzer in the same way as Example 1. The composition analysis of these particles was performed in the same way as Example 1, and it was found that the content ratio of the element C in the particles was 70 atomic percent and the C concentration ratio Q(C) against the concentration of the element C in SiC was equivalent to 1.54. Expressed by the atomic concentration ratio, the composition was Si/C/O=1.00/3.33/0.43.

The Raman values of the negative electrode material particles were determined in the same way as Example 1, and it was found that RPC was 27.7, RPSC was 1.05 and RPS was 0.38. Also, X-ray diffraction measurement was performed in the same way as Example 1 and XPsz was 0.42.

In the same way as Example 1, the negative electrode and the coin battery were produced from these negative electrode material particles and then the coin battery was evaluated. The results are shown in Table 2.

Comparative Example 6

A film-forming step was carried out in the same way as Example 1, except that the pressure of the high-purity nitrogen gas introduced to the chamber was changed to $3.2 \times 10^{-3}$ Pa. In addition, the content ratio of nitrogen in the sputtering gas was 0.2%.

The SUS substrate was detached and then the formed film was easily removed from the substrate as a thin section. One cycle of the abovementioned film-forming step provided such a thin section weighing approximately 0.6 g, and this cycle was repeated until thin sections totally weighing approximately 3 g were obtained. The obtained thin sections were ground in an agate mortar, and the resulting particles were classified by size using a sieve of 45-μm mesh size and designated as the test particles.

The volume average particle diameter of the negative electrode material particles was measured to be 10 μm using a particle size distribution analyzer in the same way as Example 1. The composition analysis of these particles was performed in the same way as Example 1, and it was found that the content ratio of the element N in the particles was 1 atomic percent and the N concentration ratio Q(N) against the concentration of the element N in SiN was equivalent to 0.02. Expressed by the atomic concentration ratio, the composition was Si/N/O=1.00/0.01/0.02.

The Raman values of the negative electrode material particles were determined in the same way as Example 1, and it was found that RPSN was 0.08 and RPS was 0.21. Also, X-ray diffraction measurement of these particles was performed in the same way as Example 1 and XPsz was 0.98.

In the same way as Example 1, the negative electrode and the coin battery were produced from these particles and then the coin battery was evaluated. The results are shown in Table 2.

Comparative Example 7

A film-forming step was carried out for 120 minutes in the same way as Example 2, except that the vapor deposition source was pellets of the mixture containing Si particles of approximately 20 μm and graphite so that the weight ratio thereof was 5/5.

The SUS substrate was detached and then the formed film was easily removed from the substrate as a thin section. One cycle of the abovementioned film-forming step provided such a thin section weighing approximately 0.5 g, and this cycle was repeated until thin sections totally weighing approximately 3 g were obtained. The obtained thin sections were ground in an agate mortar, and the resulting particles were classified by size using a sieve of 45-μm mesh size and designated as the negative electrode material particles.

The volume average particle diameter of the negative electrode material particles was measured to be 10 μm using a particle size distribution analyzer in the same way as Example 1. The composition analysis of the negative electrode material particles was performed, and it was found that the content ratio of the element C in the particles was 51 atomic percent and the C concentration ratio Q(C) against the concentration of the element C in SiC was equivalent to 1.16. Expressed by the atomic concentration ratio, the composition was Si/C/O=1.00/1.38/0.29.

The Raman values of the negative electrode material particles were determined in the same way as Example 1, and it was found that RPC was 22.10, RPSC was 1.01 and RPS was 0.42. Also, X-ray diffraction measurement of the negative electrode material particles was performed in the way described later. A distinct peak corresponding to SiC was not detected and XPsz was 0.48.

In the same way as Example 1, the negative electrode and the coin battery were produced from these negative electrode material particles and then the coin battery was evaluated. The results are shown in Table 2.

Comparative Example 8

In the same way as Example 9, fiber-like pyrolytic carbon was formed on the surface of SiO particles that had been obtained in the same way as Comparative Example 2. The content ratio of the attached fiber-like pyrolytic carbon relative to the SiO particles was 27 wt %. From the obtained composite particles, the negative electrode and the coin battery were produced and then the coin battery was evaluated in the same way as Example 9. The results are shown in Table 2.

Physical properties and other characteristics of the negative electrode material particles used in the examples and the comparative examples above are summarized in Table 1. In Table 1, the element or compound surrounded by parentheses is not included in the element Z.

TABLE 1

| | SiaZp | | | Composition of the negative electrode material particles expressed by the atomic concentration ratio | | | | Raman values of the negative electrode material particles | | | | X-ray diffractometry results of the negative electrode material particles | Particle diameter |
|---|---|---|---|---|---|---|---|---|---|---|---|---|---|
| Example | Type of the element Z | Type | Type Melting point (° C.) | Z concentration ratio Q(Z) | Si | Z | O | RPC | RPSC | RPSN | RPS | XPsz | (μm) |
| Example 1 | N | SiN | — | 0.65 | 1.00 | 0.48 | 0.03 | — | — | 0.44 | 0.49 | 0.91 | 11 |
| Example 2 | C | SiC | 2545 | 0.46 | 1.00 | 0.30 | 0.27 | 0.10 | 0.15 | — | 0.55 | 0.38 | 12 |
| Example 3 | C | SiC | 2545 | 0.52 | 1.00 | 0.35 | 0.04 | 0.05 | Peak not detected | — | 0.45 | 0.38 | 15 |
| Example 4 | N | SiN | — | 0.65 | 1.00 | 0.48 | 0.03 | — | — | 0.44 | 0.49 | 0.91 | 11 |
| Example 5 | N | SiN | — | 0.82 | 1.00 | 0.70 | 0.05 | — | — | 0.69 | 0.40 | 0.94 | 10 |
| Example 6 | C | SiC | 2545 | 0.48 | 1.00 | 0.32 | 0.42 | 0.12 | 0.18 | — | 0.68 | 0.70 | 9 |
| Example 7 | C | SiC | 2545 | 0.31 | 1.00 | 0.18 | 0.07 | 0.05 | Peak not detected | — | 0.49 | 0.15 | 12 |
| Example 8 | C | SiC | 2545 | 0.75 | 1.00 | 0.60 | 0.40 | 0.26 | 0.26 | — | 0.74 | 0.80 | 11 |
| Example 9 | C | SiC | 2545 | 0.52 | 1.00 | 0.35 | 0.04 | 0.05 | Peak not detected | — | 0.45 | 0.38 | 15 |
| Example 10 | C | SiC | 2545 | 0.52 | 1.00 | 0.35 | 0.04 | 0.05 | Peak not detected | — | 0.45 | 0.38 | 15 |
| Comparative Example 1 | (Si) | (Si) | (1414) | 0.00 | 1.00 | 0.00 | 0.02 | Peak not detected | Peak not detected | 0.09 | 0.16 | — | 10 |
| Comparative Example 2 | (O) | (SiO2) | (1726) | 0.86 | 1.00 | 0.00 | 1.33 | 0.17 | 0.06 | 0.10 | 1.09 | — | 8 |
| Comparative Example 3 | (Ni) | (NiSi2) | (1306) | 0.81 | 1.00 | 0.37 | 0.06 | Peak not detected | 0.04 | 0.07 | 0.28 | — | 14 |
| Comparative Example 4 | (B) | (SiB3) | (1270) | 0.75 | 1.00 | 0.59 | 0.03 | Peak not detected | 0.02 | 0.07 | 0.28 | — | 9 |
| Comparative Example 5 | C | SiC | 2545 | 1.54 | 1.00 | 3.33 | 0.43 | 27.70 | 1.05 | — | 0.38 | 0.42 | 12 |
| Comparative Example 6 | N | SiN | — | 0.02 | 1.00 | 0.01 | 0.02 | — | — | 0.08 | 0.21 | 0.98 | 10 |
| Comparative Example 7 | C | SiC | 2545 | 1.16 | 1.00 | 1.38 | 0.29 | 22.10 | 1.01 | — | 0.42 | 0.48 | 10 |
| Comparative Example 8 | (O) | (SiO2) | (1726) | 0.86 | 1.00 | 0.00 | 1.33 | 0.17 | 0.06 | 0.10 | 1.09 | — | 8 |

TABLE 2

| | Battery properties | | | | Ratio of electrode expansion in volume after charge/discharge cycles (A) (times) | Remarks |
|---|---|---|---|---|---|---|
| Example | Discharge capacity (mAh/g) | Charge/Discharge efficiency (%) | Charge/Discharge-cycle-maintaining ratio (A) (%) | Charge/Discharge efficiency at charge/discharge cycle 20 (%) | | |
| Example 1 | 812 | 92 | 76 | 94 | 1.3 | Scope of the present invention |
| Example 2 | 678 | 91 | 73 | 94 | 1.4 | Scope of the present invention |
| Example 3 | 812 | 93 | 72 | 94 | 1.5 | Scope of the present invention |
| Example 4 | 1505 | 91 | 69 | 85 | 1.5 | Scope of the present invention |
| Example 5 | 634 | 89 | 74 | 94 | 1.3 | Scope of the present invention |
| Example 6 | 561 | 90 | 75 | 93 | 1.3 | Scope of the present invention |
| Example 7 | 863 | 93 | 62 | 91 | 1.6 | Scope of the present invention |
| Example 8 | 520 | 84 | 80 | 93 | 1.2 | Scope of the present invention |
| Example 9 | 1976 | 73 | 95 | 98 | 1.3 | Scope of the present invention |
| Example 10 | 2090 | 77 | 93 | 98 | 1.3 | Scope of the present invention |
| Comparative Example 1 | 1078 | 93 | 30 | 87 | 2.2 | Element Z not contained |

TABLE 2-continued

| Example | Battery properties | | | | Ratio of electrode expansion in volume after charge/discharge cycles (A) (times) | Remarks |
|---|---|---|---|---|---|---|
| | Discharge capacity (mAh/g) | Charge/Discharge efficiency (%) | Charge/Discharge-cycle-maintaining ratio (A) (%) | Charge/Discharge efficiency at charge/discharge cycle 20 (%) | | |
| Comparative Example 2 | 716 | 64 | 71 | 88 | 1.3 | Element Z not contained; O contained |
| Comparative Example 3 | 788 | 93 | 31 | 87 | 1.5 | Element Z not contained; Ni contained |
| Comparative Example 4 | 820 | 90 | 43 | 88 | 1.7 | Element Z not contained; B contained |
| Comparative Example 5 | 348 | 86 | 80 | 94 | 1.2 | Element Z contained; excessive amount of C contained |
| Comparative Example 6 | 1058 | 93 | 31 | 88 | 2.0 | Element Z contained; short amount of N contained |
| Comparative Example 7 | 346 | 83 | 84 | 89 | 1.2 | Element Z contained; excessive amount of C contained |
| Comparative Example 8 | 544 | 34 | 87 | 89 | 1.2 | Element Z not contained; O contained |

Tables 1 and 2 Suggest the Following Facts.

The negative electrode material particles used in Comparative Example 1 were Si particles, which did not have the element Z on the surface thereof and thus departed from the scope of the present invention. As a result, favorable charge/discharge cycle properties could not be achieved and the ratio of electrode expansion in volume after charge/discharge cycles was large.

The negative electrode material particles used in Comparative Example 2 were SiO particles mainly constituted of the phase in which the element O was present in Si in a non-equilibrium state, and these particles had no element corresponding to the element Z on the surface thereof and thus departed from the scope of the present invention. As a result, the charge/discharge efficiency was low and the battery could not acquire the high-capacity property.

The negative electrode material particles used in Comparative Example 3 were Si/Ni particles mainly constituted of the phase in which the element Ni was present in Si in a non-equilibrium state. Although the atomic percentage of Ni contained therein fell within the scope of the present invention, the particles had no element corresponding to the element Z on the surface thereof and thus departed from the scope of the present invention. As a result, favorable charge/discharge cycle properties could not be achieved.

The negative electrode material particles used in Comparative Example 4 were Si/B particles mainly constituted of the phase in which the element B was present in Si in a non-equilibrium state. Although the atomic percentage fell within the scope of the present invention, the particles had no element corresponding to the element Z on the surface thereof and thus departed from the scope of the present invention. As a result, favorable charge/discharge cycle properties could not be achieved.

The negative electrode material particles used in Comparative Example 5 were Si/C/O particles mainly constituted of the phase in which the element C was present in Si in a non-equilibrium state. However, the content of the element C in the particles was much greater than the upper limit specified by the scope of the present invention. As a result, the presence of Si exerted no effects and only the element C was charged and discharged, so that the battery could not acquire the high-capacity property.

The negative electrode material particles used in Comparative Example 6 were Si/N particles mainly constituted of the phase in which the element N was present in Si in a non-equilibrium state, and the content of the element N in the particles was smaller than the lower limit specified by the scope of the present invention. As a result, favorable charge/discharge cycle properties could not be achieved.

The negative electrode material particles used in Comparative Example 7 were Si/C/O particles mainly constituted of the phase in which the element C was present in Si in a non-equilibrium state. However, the content of the element C in the particles was greater than the upper limit specified by the scope of the present invention. As a result, the presence of Si exerted no effects and only the element C was charged and discharged, so that the battery could not acquire the high-capacity property.

The negative electrode material particles used in Comparative Example 8 were SiO particles mainly constituted of the phase in which the element O was present in Si in a non-equilibrium state, and these particles had no element corresponding to the element Z on the surface thereof and thus departed from the scope of the present invention. As a result, the charge/discharge efficiency was low and the battery could not acquire the high-capacity property.

On the other hand, the negative electrode material particles according to the present invention used in Examples 1 to 10 had the compound $SiZ_xM_y$ of the phase in which the element Z was present in Si in a non-equilibrium state on at least the surface thereof. Also, the element Z was the element consisting of C and/or Z and satisfied the specified range of the Z concentration ratio Q(Z). Thus all the examples conformed to the scope of the present invention. Consequently, the use of such negative electrode material particles provides a high-performance battery that exhibits a high discharge capacity, a high charge/discharge efficiency at an initial stage and during charge/discharge cycles, excellent charge/discharge cycle properties and suppressed electrode expansion in volume after charge/discharge cycles.

Although the present invention was described in detail with reference to specific modes, it will be obvious to those skilled in the art that various changes may be made without departing from the spirit and scope of the present invention.

In addition, the present application is based on Japanese Patent Application filed on May 16, 2005 (Japanese Patent Application No. 2005-142827) and Japanese Patent Application filed on Aug. 18, 2005 (Japanese Patent Application No. 2005-237871), the entire contents of which are hereby incorporated by reference.

The invention claimed is:

1. A negative electrode material for a nonaqueous electrolyte rechargeable battery in the form of panicles comprising:
    at least on the surface thereof, a compound of the phase in which an element Z is present in Si in a non-equilibrium state,
wherein
    the compound contains Si, the element Z and another element M in the composition expressed by a general formula $SiZ_xM_y$, wherein
    the element Z is C,
    the element Z has a dimension of less than or equal to 500 nm,
    x is from 0.05 to 0.90,
    the element M is one element or two or more elements selected from elements other than Si and the element Z, and
    y is a number from greater than 0 to 0.5 wherein y is not 0, and
    x+y is less than or equal to 1.

2. The negative electrode material according to claim 1, wherein y is less than 0.08.

3. The negative electrode material according to claim 1, wherein y is 0.08 to 0.5.

4. The negative electrode material according to claim 1, wherein the negative electrode material consists of a compound obtained by dispersing the element Z in particles of Si.

5. A negative electrode, comprising: the negative electrode material according to claim 1.

6. A nonaqueous electrolyte rechargeable battery, comprising:
    a positive electrode;
    a negative electrode;
    lithium ions;
    and a nonaqueous electrolyte, wherein the negative electrode is the negative electrode according to claim 5.

* * * * *